United States Patent [19]
Noguchi

[11] Patent Number: 6,054,730
[45] Date of Patent: Apr. 25, 2000

[54] SEMICONDUCTOR DEVICE

[75] Inventor: Mitsuhiro Noguchi, Yokohama, Japan

[73] Assignee: Kabushiki Kaisha Toshiba, Kawasaki, Japan

[21] Appl. No.: 09/003,494

[22] Filed: Jan. 5, 1998

[30] Foreign Application Priority Data

Jan. 8, 1997 [JP] Japan ..................... 9-001438
Jun. 20, 1997 [JP] Japan ..................... 9-164427

[51] Int. Cl.$^7$ .................................................. H01L 27/108
[52] U.S. Cl. ................................... 257/306; 257/310
[58] Field of Search .......................... 257/306, 310

[56] References Cited

U.S. PATENT DOCUMENTS 5,547,885 8/1996 Ogoh .
5,796,136 8/1998 Shinkawata ............... 257/306
5,828,096 10/1998 Ohno et al. ............... 257/306

FOREIGN PATENT DOCUMENTS 53-67326 6/1978 Japan .
54-84934 7/1979 Japan .
2-246375 10/1990 Japan .
3-23673 1/1991 Japan .
8-236758 9/1996 Japan .

*Primary Examiner*—Gene M. Munson
*Attorney, Agent, or Firm*—Oblon, Spivak, McClelland, Maier & Neustadt, P.C.

[57] ABSTRACT

A semiconductor device comprises a transistor having a gate, a source, and a drain, one of the source and drain being a first end, and the other being a second end, and a capacitor comprising a storage node connected to the first end and a plate electrode, wherein a current flowing between the source and drain when a potential Va is applied to the second end and a potential Vb, which is lower than Va, is applied to the storage node is smaller than a current flowing the source and the drain when a potential Vb is applied to the second end and a potential Va is applied to the storage node, while the potential of the gate and the potential of the plate electrode are maintained to be constant. Here, the transistor should preferably be a MIS-type.

21 Claims, 30 Drawing Sheets

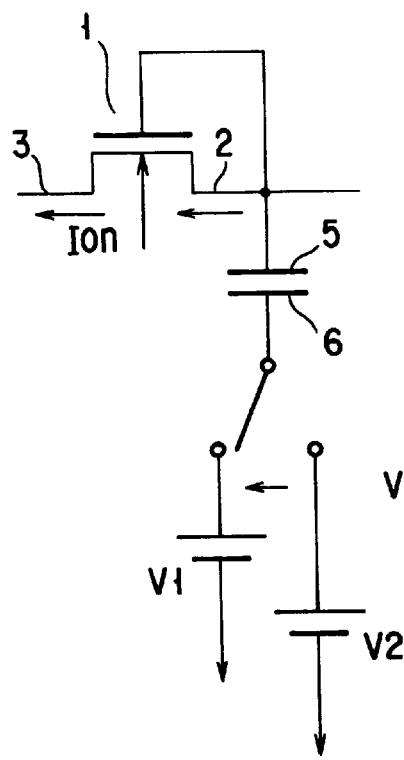
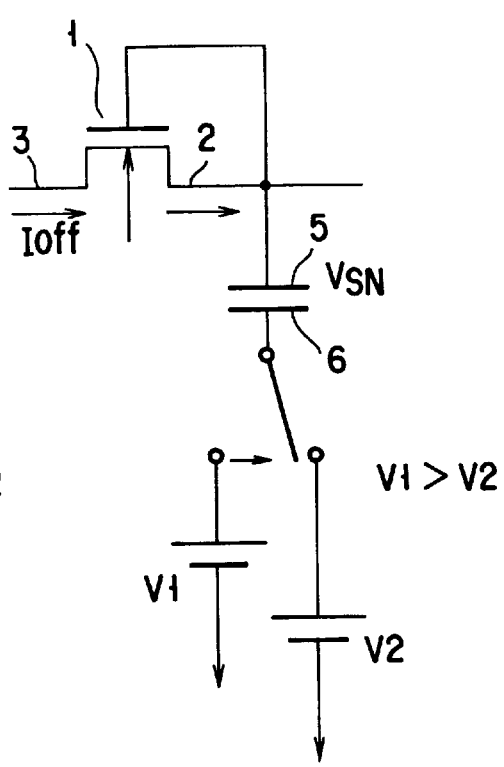
FIG. 2A (PRIOR ART)   FIG. 2B (PRIOR ART)
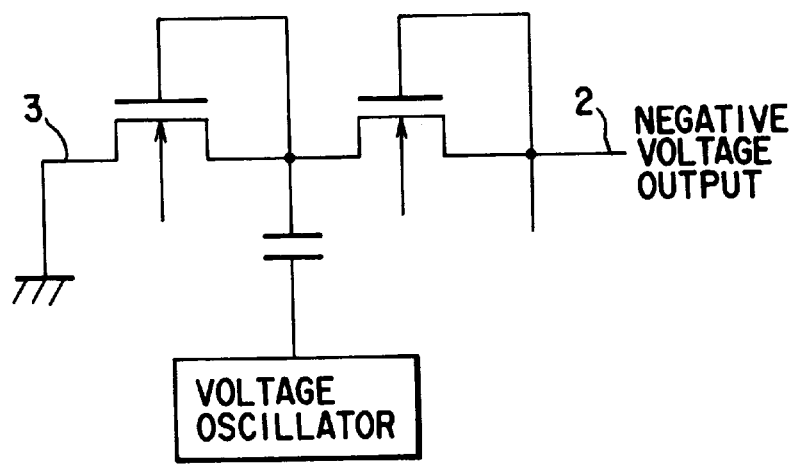
FIG. 2C (PRIOR ART)

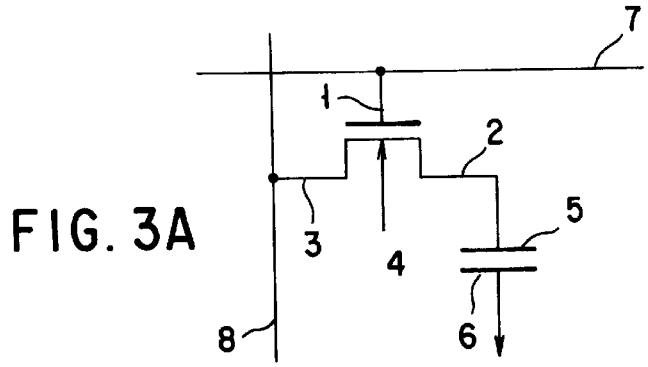
FIG. 3A
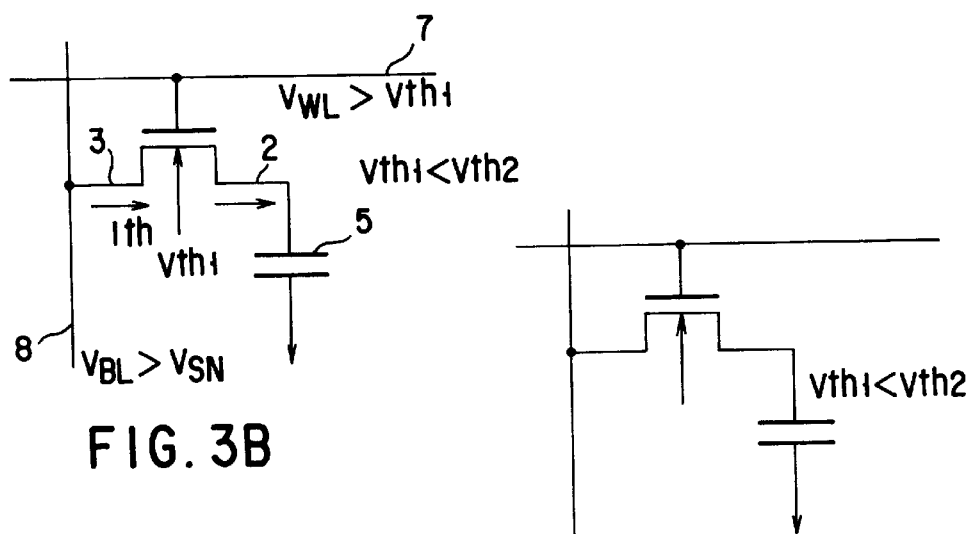
FIG. 3B
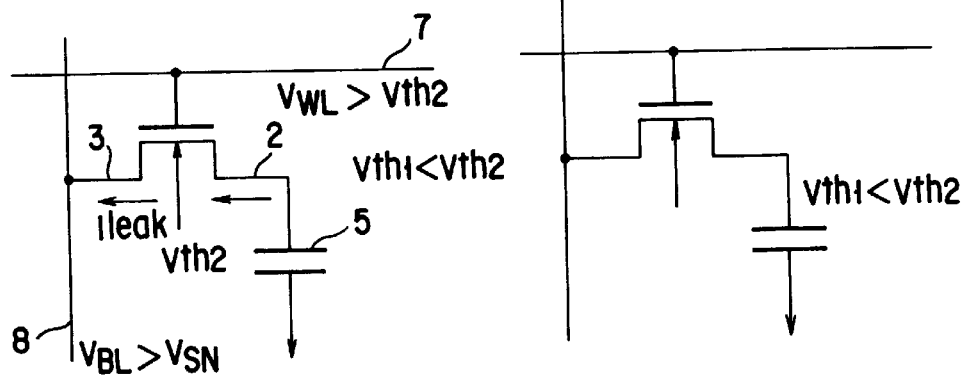
FIG. 3C
FIG. 3D

SEMICONDUCTOR DEVICE

BACKGROUND OF THE INVENTION

The present invention relates to a semiconductor device having a transistor (and particularly to a MIS-type transistor) and a capacitor, particularly to a semiconductor device which is improved in threshold voltage characteristic, and further to a semiconductor device and a semiconductor voltage conversion device.

In recent years, developments have been made to decrease the power source voltage of DRAM memory cells in order to improve reliability and to achieve low power consumption use, so that the difference between a threshold voltage Vth of a memory cell transistor and a cell "1" data write voltage Vcc has been decreased. Such DRAMs have come to cause problems of an increase of leakage between source and drains of a cell transistor due to a drop in threshold voltage and a decrease of a voltage withstanding margin of a gate insulating film due to boosting of a word line.

The problems will be firstly explained with reference to an example of a conventional DRAM memory cell prepared by a combination of a MIS-type transistor (MISFET) and a capacitor, as shown in FIG. 1A.

The memory cell shown in FIG. 1A consists of a capacitor having a plate electrode 6 and a charge storage node 5, and a MISFET having a gate electrode 1 connected to a gate control line 7, an electrode 3 (cited here as a drain electrode) of a source or a drain connected to a data transfer line 8, another electrode 2 (cited here as a source electrode) of a source or a drain connected to a storage node 5, and a substrate electrode 4.

To clarify the problems of a conventional DRAM cell, voltages at respective portions of a memory cell will be denoted by reference symbols as follows. The voltage of the gate control line 7 is denoted as VWL, the voltage of the data transfer line 8 is denoted as VBL, and the voltage of the storage node 5 is denoted as VSN. Indication of potentials at the substrate electrode 4 and the plate electrode 6 will be omitted since electric potentials of these electrodes are normally fixed to constant values in a bulk substrate or a SOI (silicon-on-insulator) substrate having a body contact.

Next, a case of writing data by boosting the storage node to a voltage Vcc will be shown in FIG. 1B. In this case, the voltage of a storage node 5 is lower than a voltage of the data transfer line 8, so that a current flows from the drain electrode 3 to the source electrode 2.

The voltage VWL of the gate control line 7 must be increased to be higher than (Vcc+Vth+ΔVth) since sufficient writing is carried out until the potential of the storage node reaches Vcc, where the threshold voltage of the cell transistor when VWL=0 V is satisfied is Vth and where an increase of the threshold voltage caused by a substrate bias effect when the voltage between the source and drains increases to Vcc is ΔVth. However, since the value of VWL is limited by a withstand voltage of a gate insulating film, Vth should be set to be low in order to restrict VWL also to be low.

If data is written with the voltage of the storage node 5 lowered to 0 V, no increase ΔVth of the threshold voltage is caused by a substrate bias effect as described above, and therefore, the problem as described above is not so serious compared to a case of writing data with the voltage of the storage node 5 boosted to the voltage of Vcc.

Next, consideration is taken into a leakage current where the electric potential of the gate control line 7 is lowered and the cell transistor is turned off, to maintain a data holding state. Since the potential of the gate control line 7 is normally set to 0 V, VWL=0 V is indicated in FIGS. 1C and 1D for conveniences. If there is a potential difference between the storage node 5 and the data transfer line 8, a sub-threshold current $I_{leak}$ of the transistor flows between the source and drain of the transistor.

Further, consideration is taken into a case of setting the potential VBL of the data transfer line 8 to 0 V where "1" has previously been written into the cell to obtain VSN to Vcc (in FIG. 1C). This case occurs when data "0" is written into another memory cell connected to the same data transfer line 8 as a target cell. In this case, a sub-threshold current $I_{leak}$ flows from the storage node 5 to the data transfer line 8, thereby decreasing the potential of the storage node 5, resulting in a problem that a sufficient voltage amplitude is not obtained when reading data. In this case, it is preferable to increase Vth since the sub-threshold current $I_{leak}$ decreases if the gate voltage VWL is decreased to be smaller in comparison with the threshold voltage Vth.

This problem of sub-threshold current also occurs where "0" has previously been written in a cell and the potential VBL of the data transfer line is set to Vcc as shown in FIG. 1D. However, the present inventors has found that a problem occurs less frequently in the case of FIG. 1D than the case of FIG. 1C.

In case of FIG. 1C, a current flows out into the data transfer line 8 from the storage node 5 by $I_{leak}$, and the potential VSN of the storage node 5 is lowered to (Vcc−dV) from Vcc. In this state, the potential of the data transfer line 8 increases by dV.Cs/CB. Normally, a data transfer line of a DRAM has a capacitance CB greater than the capacitance Cs of the storage node Cs, so that the potential of the data transfer line changes by a small change amount. The substrate bias effect is decided by the potential of the data transfer line 8 having a lower voltage than the storage node 5, i.e., by an increase dV.Cs/CB, so that the sub-threshold leakage current keeps flowing.

Meanwhile, in the case of FIG. 1D, a current flows into the storage node 5 from the data transfer line 8 due to $I_{leak}$, and the potential VSN of the storage node increases to +dV from 0. In this case, the charge change amount is dV.Cs and is equal to the value indicated in FIG. 1C. However, the potential of the data transfer line 8 decreases by dV.Cs/CB where the capacitance of the storage node of the cell is Cs, unlike the case of FIG. 1D. In this state, the substrate bias effect is decided by the potential of the storage node 5 having a voltage lower than the data transfer line 8, i.e., by an increase dV. The increase dV is greater than the increase dV.Cs/CB shown in FIG. 1C and the threshold voltage increases due to the substrate bias effect depending on the increase dV, so that the sub-threshold leakage current stops flowing in.

As described above, the threshold voltage Vth must be restricted to be low in order to write data "1" into a cell, while the threshold voltage Vth must be maintained high in order to restrict a sub-threshold leakage current from a cell. This leads to a problem that two desirable conditions are thus required for the threshold voltage. This problem appears conspicuously in a DRAM of a low power source voltage operation which cannot maintain a sufficient difference between an amplitude Vcc of a writing voltage and a threshold voltage Vth.

A similar problem occurs in a memory using a ferroelectric capacitor in which the voltage of a plate electrode 6 is set to a so-called (½)Vcc when holding data. The structure of a memory cell is similar to the above as long as a ferroelectric film is used as a capacitor insulating film, and explanation thereof will be omitted herefrom. In a ferroelectric capacitor in which the voltage of a plate electrode 6 is set to (½)Vcc, when the storage node voltage of a cell in which "1" has been written changes from Vcc to 0 V by a sub-threshold leakage current, as shown in FIG. 1, the direction of an electric field applied between the plate electrode 6 and the storage node 5 is inverted, i.e., a so-called polarization inversion occurs and the data in the memory cell is broken.

Further, a similar problem occurs in a charge pump circuit. FIGS. 2A to 2C show basic units of a charge pump circuit consisting of a capacitor and a MISFET. The capacitor has a plate electrode 6 and a charge capacitance electrode 5. The MISFET comprises an electrode 3 (cited here as a drain electrode) as one of a source and a drain connected to an output end, and another electrode 2 (cited here as a source electrode) as the other of the source and drain, and a gate 1 connected together with the electrode 2 to the storage node 5. Further, the plate electrode 6 is alternately connected periodically to a plurality of voltage sources having two different voltages V1 and V2, by and element as a switch.

A conventional charge pump circuit has a problem as explained below.

In a charge pump circuit, basically, two power sources V1 and V2 are alternately connected so that electric charges are moved in a direction from the source electrode 2 to the drain electrode 3, thereby to obtain a potential difference between the electrodes 2 and 3. FIGS. 2A to 2C show a case in which the voltage of the drain electrode 3 is boosted in comparison with the voltage of the source electrode 2.

FIG. 2A shows a case in which the plate voltage is switched from the voltage source V2 to the voltage source V1. Here, since the voltage V1 is higher than the voltage V2, the plate potential increases. Accordingly, the potential of the storage node 5 increases and the voltage of the gate electrode 1 increases by about (V1–V2), to be higher than a threshold voltage Vth. As a result, the transistor is turned on and electric charges stored in the storage node 5 is transferred to the drain electrode 3. Where the potential of the storage node 5 turned on is VSN, the potential of the drain electrode 3 is VSN–Vth. In order to restrict a decrease of VSN–Vth, the threshold voltage Vth should preferably be low.

Next, FIG. 2B shows a case in which the plate voltage is switched from the voltage source V1 to the voltage source V2. In this case, since the voltage V2 is lower than the voltage V1, the plate potential decreases. Accordingly, the potential of the storage node 5 decreases by about (V1–V2) and the voltage of the gate electrode 1 decreases to be equal to or lower than Vth. As a result, the transistor is turned off. Here, a sub-threshold current flows from the drain electrode 3 to the source electrode 2 in a direction opposite to that when the transistor is turned on, i.e., in a direction opposite to the direction in which electric charges are transferred in FIG. 2A, thereby causing a loss of transferred charges. In order to restrict the loss of transferred charges, the threshold voltage Vth of the transistor should preferably be high.

From above, the threshold voltage Vth must be restricted to be low in order to prevent a voltage drop when the transistor is turned on, while the threshold voltage Vth must be maintained to be high in order to restrict a loss of transferred charges caused by a sub-threshold leakage through a transistor. There is a problem that two different conditions are thus required for a threshold voltage. This problem appears conspicuously in a booster circuit and a negative voltage generator circuit, operated by a low power source voltage by which a sufficient difference cannot be maintained between an amplitude Vcc of a writing voltage and a threshold voltage Vth.

FIG. 2C shows an example of a negative voltage generator circuit in which a voltage oscillator circuit is used in place of power sources V1 and V2. More specifically, two MISFETs each having a gate and a source connected together are connected in series with each other, and the end of a drain electrode 3 of this serial connection is connected to a ground end (0 V) as an input while the end of a source electrode 2 thereof is connected to an output end. A connection point between transistors is connected to a voltage oscillator circuit through a capacitor. This kind of negative voltage generator circuit also uses a charge pump circuit and therefore has a similar problem.

As a result of developments and studies made by the present inventors, the following problem has been revealed.

In a conventional semiconductor memory device using a memory cell, such as a DRAM or the like, the threshold voltage Vth must be restricted to be low in order to maintain a sufficient cell writing current while the threshold voltage Vth must be maintained to be high in order to restrict a sub-threshold leakage current from a cell. A problem thus lies in that two contradictory requirements must be satisfied for the threshold voltage.

In a charge pump circuit, also, the threshold voltage Vth must be restricted to be low in order to restrict a voltage drop when a transistor is turned on while the threshold voltage Vth must be maintained to be high in order to restrict a loss of transferred charges caused by a sub-threshold leakage. A problem thus lies in that two contradictory requirements must also be satisfied for the threshold voltage.

BRIEF SUMMARY OF THE INVENTION

The object of the present invention is to provide a semiconductor device as follows.

(1) A semiconductor device maintains a sufficient current amount when a current is supplied to a capacitor through a transistor, and reduces a sub-threshold leakage caused by a transistor.

(2) A semiconductor device maintains a sufficient current when data is written into a memory cell, and reduces a sub-threshold leakage current when data is maintained in a memory cell, so that the operation speed and the operation reliability are improved.

(3) A semiconductor device is used as a semiconductor voltage conversion device which reduces a decrease of a voltage when a transistor is turned on, so that the boosting efficiency can be improved.

The subject matter of the present invention is to use a transistor having a threshold voltage which changes depending on a current flow direction, as a transistor for a memory cell, a charge pump circuit, or the like.

The present invention is characterized in that the threshold voltage Vth is low when data of a high voltage is written into a memory cell and the threshold voltage Vth is high when data is maintained in a memory cell. In case of applying the present invention to a charge pump circuit, the threshold voltage Vth is restricted to be low with respect to a current flowing in a direction in which electric charges are transferred, so that a voltage drop equivalent to the threshold voltage is reduced, while the threshold voltage Vth is high with respect to a current in a direction opposite to the direction in which electric charges are transferred, so that a loss of electric charges caused by a sub-threshold leakage is reduced.

More specifically, the present invention is characterized by the following structure. Note that a threshold voltage described herein is defined as a gate voltage which satisfies 20 nA (W/L) where L is a gate length and W is a transistor width.

A first semiconductor device according to the present invention comprises a transistor having a gate, a source, and a drain, one of the source and drain being a first end and the other being a second end; and a capacitor comprising a storage node connected to the first end, and a plate electrode, wherein a current flowing between the source and drain when a potential Va is applied to the second end and a potential Vb, which is lower than Va, is applied to the storage node is smaller than a current flowing the source and the drain when a potential Vb is applied to the second end and a potential Va is applied to the storage node, while the potential of the gate and the potential of the plate electrode are maintained to be constant.

A second semiconductor device according to the present invention comprises a transistor having a gate connected to a gate control line, a source, and a drain, one of the source and drain being a first main electrode connected to a data transfer line, and the other being a second main electrode; and a capacitor comprising a storage node connected to the second main electrode, and a plate electrode connected to a common electrode, wherein the transistor and the capacitor constitute a memory cell, and a threshold voltage when a potential Va is applied to the data transfer line and a potential Vb, which is higher than Va, is applied to the storage node is higher than a threshold voltage when a potential Vb is applied to the data transfer line and a potential Va is applied to the storage node, while the potential of the gate and a potential of the plate electrode are maintained to be constant. Preferred embodiments of the second semiconductor device according to the present invention are as follows.

(1) A current flowing between the source and drain is larger than a current flowing between the second main electrode and a substrate, when a voltage of the gate is smaller than a threshold voltage.

(2) A plurality of memory cells are connected to one data transfer line, and the data transfer line has a capacitance larger than the storage node has.

(3) An impurity density of a channel region in a side of the first main electrode is higher than in a side of the second main electrode, below the gate electrode. Here, the gate electrode is formed along a first direction on a substrate main surface. Among two parallel cross-sectional views essentially including the gate electrode in the first direction, the first cross-section of the two cross-section is closer to the first main electrode of the transistor than the second cross-section thereof. The distance from the first cross-section to the end of the gate electrode is equal to the distance from the first cross-section to the end of the gate. Supposing that the source and drain regions have a conductivity type of a first conductivity and a conductivity type opposite to the first conductivity is a second conductivity type, a value of (the density of impurities of the second conductivity type—the density of impurities of the first conductivity type) at the channel region on the second cross-section is lower than that at the channel region on the first cross-section.

(4) The channel region having the higher impurity density is formed apart from an interface between the gate insulating film and the substrate.

(5) The transistor is a transistor having a threshold voltage which decreases as a channel width is narrowed, and the channel width is wider in a side of the first main electrode than in a side of the second main electrode.

(6) The transistor is a transistor having a threshold voltage which increases as a channel width is narrowed, the gate is substantially formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate is equal to a distance from the second cross-section to the other end of the gate, and a width of a transistor region having a contact with the gate through a gate insulating film along the substrate main surface on the first cross-section is narrower than a width of a transistor region having a contact with the gate through a gate insulating film along the substrate main surface on the second cross-section.

(7) The width of the transistor region on arbitrary one of the first cross-sections is narrower than the width of transistor region on arbitrary one of the second cross-sections.

(8) The transistor is a transistor having a threshold voltage which decreases as a channel width is narrowed, the gate is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate is equal to a distance from the second cross-section to the other end of the gate, and a width of a transistor region having a contact with the gate through a gate insulating film along the substrate main surface on the first cross-section is wider than a width of a transistor region having a contact with the gate through a gate insulating film along the substrate main surface on the second cross-section.

(9) The width of the transistor region on arbitrary one of the first cross-sections is wider than the width of transistor region on arbitrary one of the second cross-sections.

(10) The memory cell is formed on a semiconductor substrate, an element isolation insulating film is embedded in a peripheral region of the transistor, and an angle between the main surface of the semiconductor substrate and a side surface of the transistor region across the element isolation insulating film is greater at a side of the second main electrode than at a side of the first main electrode, in a channel width direction of the transistor.

(11) The transistor is formed along a substrate main surface, such that a side surface of the transistor is in contact with an element isolation insulating film, the gate electrode is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate electrode is equal to a distance from the second cross-section to the other end of the gate electrode, and an angle forming between the main surface of the semiconductor substrate and a side surface of the transistor region on the first cross-section across the element isolation insulating film is greater than an angle forming between the main surface of the semiconductor substrate a side surface of the transistor region on the second cross-section across the element isolation insulating film.

(12) The capacitor includes a second transistor having a source a drain and a gate connected to the second main electrode to function as a storage node, a substrate electrode of the second transistor or at least one of the source and drain thereof is connected to a common electrode to form a capacitor between the second main electrode and the common electrode, and the second transistor has a threshold voltage within a range of an amplitude of a voltage of the storage node.

(13) The gate is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate is equal to a distance from the second cross-section to the other end of the gate, and in a direction normal to the substrate main surface, a distance of the gate insulating film from an end of a depletion layer in the substrate on the second cross-section is greater than a distance on the first cross-section, on condition that a potential difference between the source and drain is 0 V, and that a voltage of the gate is smaller than the threshold voltage.

(14) The transistor region is formed along a substrate main surface so as to have a side surface in contact with an element isolation insulating film, the gate is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate electrode is equal to a distance from the second cross-section to the other end of the gate electrode, and a height from an interface between the element isolation insulating film and the gate electrode to a an interface between the gate-insulating film and the substrate main surface around the side surface of the transistor region on the second cross-section is smaller than a height from an interface between the element isolation insulating film and the gate electrode to an interface between the gate-insulating film and the substrate main surface around the side surface of the transistor region on the first cross-section.

(15) The height of an interface between the element isolation insulating film and gate electrode is lower than the height of a main surface of the gate-insulating film/semiconductor-channel of the transistor at side surface of the transistor region.

(16) The transistor region is formed along a substrate main surface so as to have a side surface in contact with an element isolation insulating film, the gate is formed along a first direction, a distance between two parallel the first and second cross-sections including the gate electrode in the first direction is equal to with each other, the first cross-section is closer to the first main electrode of the transistor than the second cross-section thereof, and the first cross-section and the gate electrode ??, and a radius of curvature of a corner portion consisting of the semiconductor region formed by a side surface of the transistor region on a first cross-section, a substrate, and a gate insulating film is greater than a radius of curvature of a corner portion consisting of the semiconductor region formed by a side surface of the transistor region on a second cross-section, the substrate, and the gate insulating film.

A third semiconductor device according to the present invention comprises a transistor having a gate, a source, and a drain, one of the source and drain being a first main electrode and the other being a second main electrode connected to the gate electrode; and a capacitor comprising a storage node connected to the second main electrode, and a plate electrode, wherein a predetermined voltage is applied to the plate electrode such that the storage node has potentials of two values, one being a first voltage higher than a threshold voltage of the transistor and the other being a second voltage lower than the threshold voltage, the storage node has a higher potential than the first main electrode when the storage node is applied with the first voltage, and the first main electrode has a higher potential than the storage node when the storage node is applied with the second voltage, and the transistor has a lower threshold voltage when the storage node is applied with the first voltage than when the storage node is applied with the second voltage.

A fourth semiconductor device according to the present invention comprises a transistor having a gate connected to a gate control line, a source, and a drain, one of the source and drain being a first main electrode connected to a data transfer line, and the other being a second main electrode; and a capacitor having a storage node connected to the second main electrode and a plate electrode connected to a common electrode, wherein the transistor and the capacitor constitute a memory cell, the storage node is electrically connected with alternatively two voltage sources having different voltages from each other via the data transfer line and the transistor, and data are stored as information of an electric charge or an electric polarity, and a retention time of an electric charge or an electric polarity is longer when data holding state is set after the storage node is connected to the first voltage source having a high voltage than when data holding state is set after the storage node is connected to the second voltage source having a low voltage. Here, the data transfer line is connected to a plurality of memory cells, after the data transfer line is connected to the first voltage source and the gate voltage is set at the third predetermined voltage higher than the threshold voltage, then the first data retention time of the memory cell is determined on condition that the memory cell is connected to the second voltage after changing the gate voltage to the fourth predetermined voltage lower than the threshold voltage, and after the data transfer line is connected to the second voltage source and the gate voltage is set at the third predetermined voltage, and then the second data retention time of the memory cell is determined on condition that the memory cell is connected to the first voltage after changing the gate voltage to the fourth predetermined voltage, and the first data retention time is longer than the second data retention time.

A fifth semiconductor device according to the present invention comprises: a transistor having a gate connected to a gate control line, a source, and a drain, one of the source and drain being a first main electrode connected to a data transfer line, and the other being a second main electrode; and a capacitor consist of a storage node connected to the second main electrode and a plate electrode connected to a common electrode, wherein the transistor and the capacitor constitute a memory cell, the transistor region is formed along a first direction on a substrate main surface, among two parallel cross-sectional views essentially including the gate electrode in the first direction, the first cross-section of the two cross-section is closer to the first main electrode of the transistor than the second cross-section thereof, a distance from the first cross-section to an end of the gate electrode is equal to a distance from the first cross-section to the end of the gate electrode, and the gate insulating film has a smaller thickness on the second cross-section than on the first cross-section.

Explanation will now be made of the operation of a semiconductor device constructed as described above.

In case of applying the present invention to a DRAM or the like, the threshold voltage of the transistor can be decreased to be low when the potential of the second main electrode connected to the capacitor of the transistor is set to be lower than the potential of the first main electrode not connected to the capacitor. Inversely, the threshold voltage of the transistor can be raised to be high when the potential of the second main electrode connected to the capacitor is set to be higher than the potential of the first main electrode not connected to the capacitor.

Therefore, when the transistor is turned on and a current is made flow from the first main electrode not connected to the capacitor to the second main electrode connected to the capacitor to store electric charges in the capacitor, it is possible to maintain a large writing current by maintaining the threshold voltage to be low. Accordingly, it is possible to shorten the writing time required for writing a predetermined amount of electric charges. In addition, since the gate voltage required for obtaining a predetermined drain current can be restricted to be low, a voltage stress applied to the gate insulating film can be reduced to be small. Therefore, an occurrence of a trap in an insulating film or an occurrence of an interface level caused by a voltage stress applied to an insulation can be restricted, and a change of a threshold voltage, a leakage current from an insulating film through a trap, a leakage current from a transistor through an interface level, and a parasitic capacitance can be restricted. In addition, a time to be elapsed until a gate insulating film causes an insulation break-down can be extended and a much thinner gate insulating film can be used.

Inversely, when the transistor is turned off and electric charges are maintained, a sub-threshold leakage current from the second main electrode not connected to the capacitor to the first main electrode connected to the capacitor can be reduced to be small by maintaining the threshold voltage to be high. Therefore, a loss of electric charges stored in the capacitor can be reduced to be small, and it is possible to restrict an increase in number times for which refreshing is required due to a loss of electric charges and an increase of the power consumption.

In case of applying the present invention to a charge pump or the like, the threshold voltage of the transistor can be raised to be high when the potential of the second main electrode is set to be higher than the potential of the first main electrode. Inversely, the threshold voltage of the transistor can be decreased to be low when the potential of the second main electrode is set to be lower than the first main electrode.

Therefore, when a current is made flow from the second main electrode to the first main electrode to discharge electric charges to the capacitor with the transistor turned on, a large drain current can be maintained by maintaining the threshold voltage to be low. Therefore, it is possible to discharge sufficient electric charges even when the capacitance of the capacitor is increased. A large output current can be obtained by increasing the driving frequency of the capacitor. In addition, the decrease in the output voltage, equivalent to the threshold voltage of the transistor, can be reduced, so that a much higher output voltage and a high conversion efficiency can be attained. Further, since the gate voltage required for obtaining a predetermined drain current can be restricted to be low, a voltage stress applied to the gate insulating film can be reduced. Therefore, an occurrence of a trap in an insulating film or an occurrence of an interface level caused by a voltage stress applied to an insulation can be restricted, and a change of a threshold voltage, a leakage current through a trap, a leakage current from a transistor through an interface level, and a parasitic capacitance can be restricted. In addition, a time to be elapsed until a gate insulating film causes an insulation break-down can be extended and a much thinner gate insulating film can be used.

Inversely, when the transistor is turned off and electric charges are maintained, a sub-threshold leakage current from the first main electrode to the second main electrode can be reduced to be small by maintaining the threshold voltage to be high. Therefore, a loss of electric charges stored in the capacitor can be reduced to be small, and it is possible to restrict an increase of the power consumption and a decrease of the efficiency caused by a loss of electric charges.

As has been explained above, according to the present invention, it is possible to realize a semiconductor device which is capable of maintaining a sufficient current when a current is supplied to a capacitor through a transistor and of restricting a sub-threshold leakage caused by a transistor, by using a transistor whose threshold voltage changes depending on the direction in which a current flows.

Further, in case of applying the present invention to a semiconductor memory device such as a DRAM or the like, it is possible to maintain a sufficient current when data is written into a memory cell and to reduce a sub-threshold leakage current when data is maintained in a memory cell, by making an arrangement such that the threshold voltage Vth is reduced to be low when data of a high voltage is written into a memory cell and the threshold voltage Vth is raised to be high when data is maintained in a memory cell. Therefore, the operation speed and the operation reliability can be improved.

In case of applying the present invention to a semiconductor voltage converter circuit or the like, the threshold voltage Vth is restricted to be low with respect to a current flowing in a direction in which electric charges are transferred, thereby to reduce a decrease of a voltage equivalent to the threshold voltage. With respect to a current flowing in a direction opposite to the direction in which electric charges are transferred, the threshold voltage Vth is raised to be high, thereby to restrict a loss of transferred charges caused by a sub-threshold leakage. In this manner, a decrease of a voltage can be decreased when the transistor is turned on, while restricting the sub-threshold leakage. The voltage conversion efficiency can thus be improved.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 2A to 2C are views for explaining a structure of a conventional charge pump and a problem thereof;

FIGS. 3A to 3D are circuit diagrams showing a semiconductor memory device according to a first embodiment of the present invention;

DETAILED DESCRIPTION OF THE INVENTION

Figures 1A, 1C:
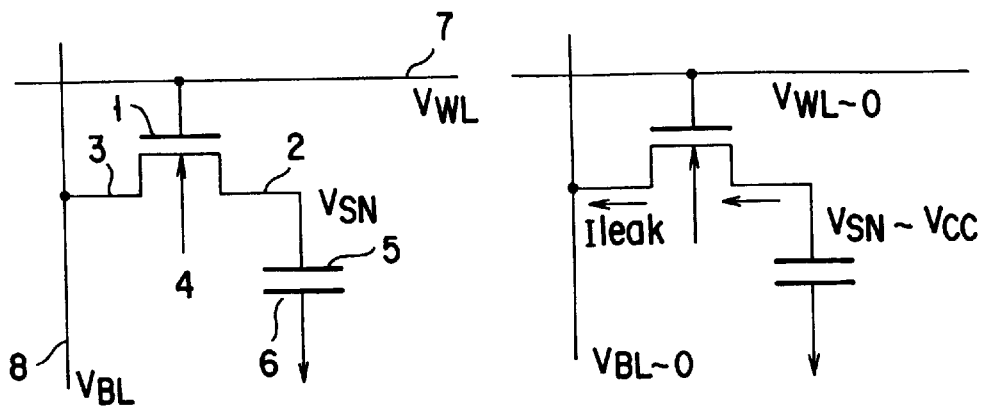
FIGS. 1A to 1E are views for explaining a problem in a conventional DRAM memory cell.
Figures 1B, 1D:
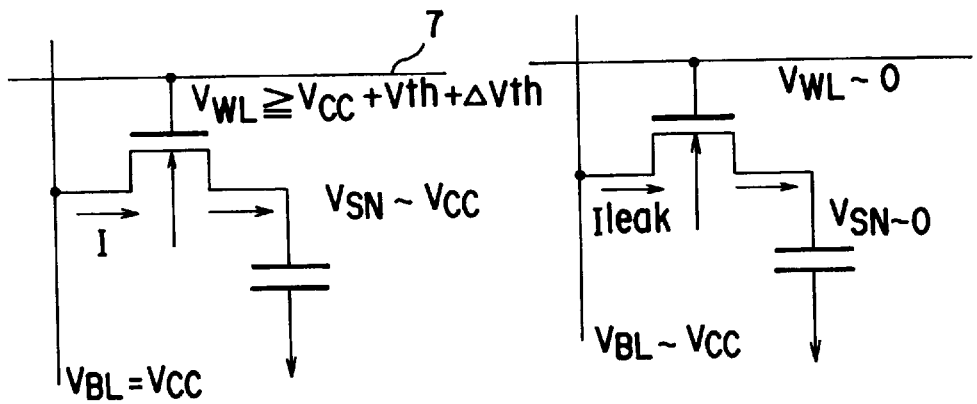
Figure 1E:
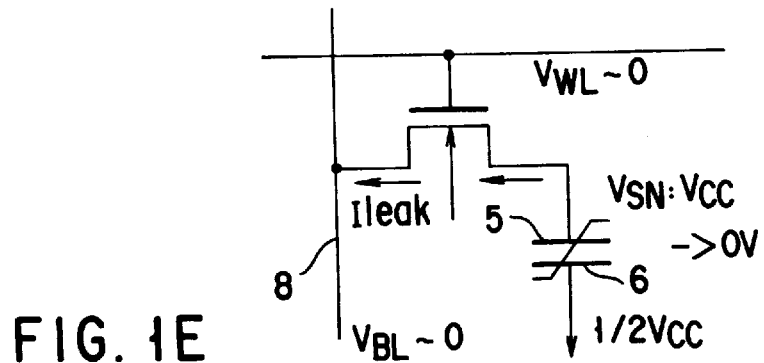

In the following, details of the present invention will be explained with reference to embodiments shown in the drawings.

First Embodiment

FIG. 3A shows a circuit diagram according to a first embodiment of the present invention. FIG. 3B shows a case where a transistor is turned on and electric charges are injected into a storage node. FIG. 3C shows a case where a transistor is turned off and capacitor charges are maintained.

The circuit shown in FIGS. 3A to 3D constitutes a memory cell using a capacitor, and consists of a capacitor and a MIS-type field effect transistor (MISFET). The capacitor comprises a capacitor charge storage node 5 opposed to a plate electrode 6 with a capacitor insulating film inserted therebetween. The MISFET comprises a gate electrode 1 connected to a gate control line 7, a first main electrode 3 (cited here as a drain electrode) forming either one of a source and a drain connected to a data transfer line 8, a second main electrode 2 (cited here as a source electrode) forming the other one of the source and drain, and a substrate electrode 4.

Voltages at respective portions of a memory cell will be denoted by the following reference symbols. The voltage of the gate control line 7 is VWL, the voltage of the data transfer line 8 is VBL, and the voltage of the storage node 5 is VSN. Symbols of the potentials of the substrate electrode 4 and the plate electrode 6 will be omitted since the potentials thereof are fixed to constant values.

FIG. 3B shows a case where data is written into the storage node 5 from the data transfer line 8. In this case, the voltage of the storage node 5 is lower than the voltage of the data transfer line 8, and therefore, a current flows in a direction from the drain electrode 3 to the source electrode 2. The threshold voltage of the cell transistor in this state is expressed as Vth1 and the current supplying the threshold voltage and flowing from the data transfer line 8 is expressed as Ith. In consideration of a case of causing a current to flow inversely in a direction from the source electrode 2 to the drain electrode 3, the threshold voltage which causes the current Ith to flow from the storage node 5 is expressed as Vth2. The present invention is characterized in that Vth1<Vth2 is satisfied. This relationship concerning threshold voltages is realized by a method as will be describe in details later.

When writing data into the storage node 5 from the data transfer line 8, the voltage VWL of the gate control line 7 must be higher than (Vcc+Vth1+ΔVth) where the threshold voltage of the cell transistor at VWL=0 V is Vth1 and an increase of the threshold voltage caused by a substrate bias effect when the source-drain voltage increases to Vcc is ΔVth, since sufficient writing is performed until the potential of the storage node 5 reaches Vcc. However, VWL can be restricted to be low since Vth1 is low.

On the contrary, consideration is taken into a leakage current of a memory cell when the potential of the gate control line 7 is decreased and the cell transistor is turned off, i.e., when VWL<Vth2 is satisfied and data is maintained. In particular, consideration is taken into a case of FIG. 3C where "1" has previously been written in a cell and the potential VSN of the storage node 5 is set to be lower than the potential VBL of the data transfer line 8. For example, this case appears when data "0" is written into a second memory cell connected to the same data transfer line as that connected with a target CELL. In this case, a problem occurs in that a current $I_{leak}$ flows from the storage node 5 to the data transfer line 8, so that the potential of the storage node 5 decreases and a sufficient voltage amplitude cannot be obtained when reading data.

However, if the structure is arranged so as to satisfy a condition of Vth2>Vth1 as in the present invention, it is possible to reduce a sub-threshold current $I_{leak}$ to be smaller than in a conventional technique, so that the leakage current can be restricted. For example, where a sub-threshold swing coefficient is expressed as S [V/decade], the sub-threshold current $I_{leak}$ decreases to 10{-(Vth2-Vth1)/S} in a circuit diagram according to the present invention, compared with a normal Vth2=Vth1 [V].

In the circuit diagram as described above, the threshold voltage of the MISFET can be lowered when the potential of the source electrode 2 connected to the capacitor is lower than the drain electrode 3 not connected to the capacitor. In addition, when the source electrode 2 connected to the capacitor is set to be higher than the potential of the drain electrode 3 not connected to the capacitor, the threshold voltage of the MISFET can be raised. Therefore, when the MISFET is turned on and a current is made flow from the drain electrode 3 not connected to the capacitor to the source electrode 2 connected thereto to store electric charges into the capacitor, a large writing current can be maintained by maintaining the threshold voltage to be low. Accordingly, it is possible to shorten a writing time required for writing a predetermined amount of electric charges.

In addition, since the gate voltage required for obtaining a predetermined drain current can be restricted to be low, a voltage stress applied to the gate insulating film can be reduced. Therefore, an occurrence of a trap in an insulating film or an occurrence of an interface level caused by a voltage stress applied to an insulation can be prevented. A change of a threshold voltage due to carrier capture, a leakage current from an insulating film through a trap, a leakage current from a transistor through an interface level, and a parasitic capacitance can be restricted. Further, a time until a gate insulating film causes an insulation break-down can be extended and a much thinner gate insulating film can be used.

Furthermore, the booster voltage of the circuit boosting the gate voltage during the write operation can be maintained to be low, therefore, small booster circuit having a small booster ratio and a small driving ability. Then, a problem of the junction breakdown by the high-voltage in the booster circuit can be reduced and an area of the booster circuit can be reduced.

Inversely, when the MISFET is turned off to maintain electric charges, a sub-threshold leakage current from the source electrode 2 connected to the capacitor to the drain electrode 3 not connected to the capacitor can be reduced to be small by maintaining the threshold voltage to be high. Therefore, a loss of electric charges stored in the capacitor can be reduced to a small value, and the power consumption can be prevented from being increased due to a loss of electric charges.

In particular, when electric charges are maintained in a conventional case in which the threshold voltage does not change depending on the direction of a current flowing, the sub-threshold leakage current from a source electrode connected to a capacitor to a drain electrode not connected thereto is greater than the current flowing in an opposite direction, since the substrate bias effect is small. In contrast, in the relationship concerning threshold voltages according to the present embodiment, i.e., when a relation of Vth1<Vth2 is satisfied, a sub-threshold leakage current from the source electrode 2 connected to the capacitor to the drain electrode 3 not connected thereto, i.e., the leakage current when the potential of the storage node 5 is higher than the potential of the data transfer line 8 can be reduced to be smaller than the leakage current in case of a current flowing in an opposite direction, i.e., than the leakage current when the potential of the capacitor 5 is lower than the potential of the data transfer line 8.

Of course, a capacitor for use in the above structure may adopt a ferroelectric film. As has been explained with reference to conventional techniques, a polarization inversion is caused by a sub-threshold leakage current from the source electrode connected to the capacitor to the drain electrode not connected thereto and the information is destroyed in a ferroelectric capacitor of a (½)Vcc plate method. However, with use of the structure as described above, the leakage current can be reduced to prevent a polarization inversion.

Further, to use such a semiconductor device in a memory cell array, a structure in which a plurality of memory cell array are connected to one data transfer line may be suggested as shown in FIG. 3D.

In this case, it is necessary that a first memory cell should be brought into a holding state and data should be written into a second memory connected to a data transfer line 8 common to the first memory cell. Therefore, in a device which causes a change in voltage of a storage node 5 depending on the storage state of data, for example, there must be a case in which the potential VBL of a data transfer line 8 is lower than the potential VSN of a storage node 5 of the first memory cell in a step of writing data into a second memory cell with a low voltage immediately after writing into a first memory cell is performed with a high voltage thereby maintaining the memory cell in a data holding state. Hence, the sub-threshold leakage current can be efficiently restricted by threshold voltage conditions according to the present embodiment.

Next, explanation will be made to a specific example of a device structure in the following embodiment.

Second Embodiment

In this embodiment, an embodiment relating to a COB (Capacitor-on-bitline) type DRAM will be indicated.

Figure 4:
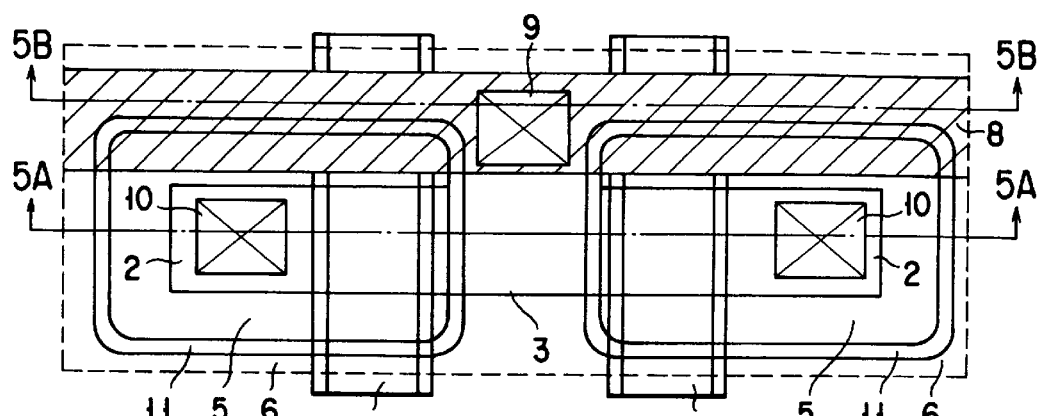
FIG. 4 is a plan view of a cell portion of a COB-type DRAM according to a second embodiment.
Figure 5A:
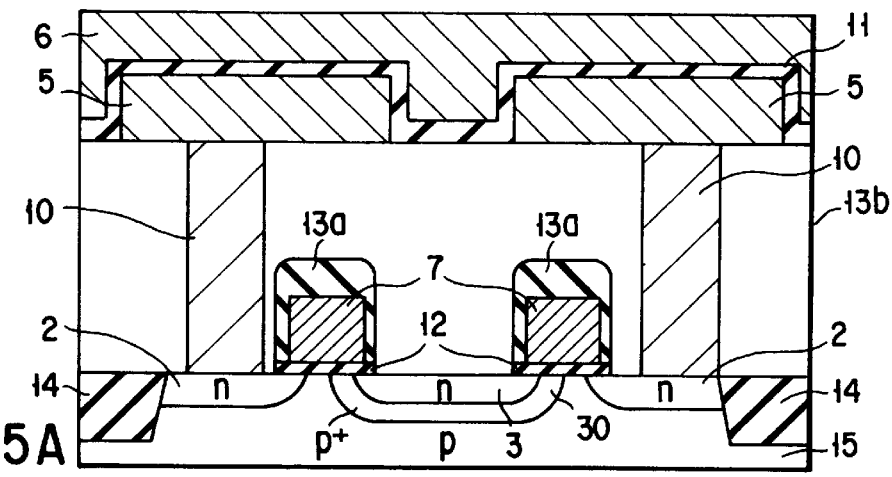
FIGS. 5A and 5B are cross-sectional views cut along lines 5A—5A and 5B—5B in FIG. 4.
Figure 5B:
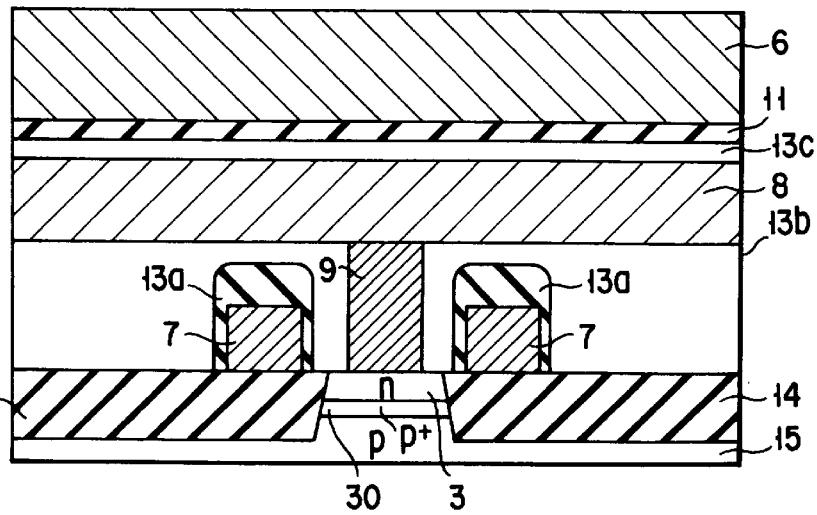

FIG. 4 is a plan view of a cell portion of a COB-type DRAM. FIGS. 5A and 5B are cross-sectional views cut along a line 5A–5B and a line 5B—5B in FIG. 4, respectively. To clearly show the structure of a portion under the capacitor, capacitor storage nodes and capacitor insulating films, and plate electrodes 6 are indicated only by their contours.

In FIGS. 4, 5A, and 5B, a reference numeral 2 denotes a source electrode (or a second main electrode) made of an n-type diffusion layer, a reference numeral 5 denotes a storage node of the capacitor, a reference numeral 6 denotes a plate electrode, a reference numeral 7 denotes a gate electrode (or a gate control line), a reference numeral 8 denotes a bit line (or a data transfer line), a reference numeral 9 denotes a contact with the data transfer line 8, a reference numeral 10 denotes a contact with the storage node 5, and a reference numeral 11 denotes a capacitor insulating film, a reference numeral 12 denotes a gate insulating film, reference numerals 13 (13a, 13b, and 13c) denote a side wall insulating film and an interlayer insulating film, a reference numeral 14 denotes an element isolation insulating film, a reference numeral 15 denotes a p-type semiconductor region, and a reference 30 denotes a high density impurity layer (or a $p^+$-type layer).

In the present embodiment, two memory cells are formed in an element forming region surrounded by the element isolation film 14. However, the memory cells need not always be formed in this structure, but may be formed independently.

A memory cell region is formed on a p-type semiconductor region 15 and the element forming region is divided by the element isolation insulating film 14 formed on the substrate surface. A gate electrode 7 is formed on the region 15 with a gate insulating film inserted therebetween. The gate electrode 7 is patterned in one direction of the cell array so as to form a gate control line. In both sides of the gate electrode 7, n-type layers 2 and 3 are formed and combined with the gate electrode 7 to constitute a MISFET of a cell transistor.

A storage node contact 10 for making an electric connection with a storage node 5 is formed on the n-type layer (or source electrode) 2. In addition, an upper portion of the n-type layer (or drain electrode) 3 is connected to a conductive line 8 through a bit line contact 9, and the conductive member 8 is patterned in one direction to form a data transfer line. Further, a storage node 5 is formed on the source electrode 2 in the opposite side with respect to the gate electrode 7, with the storage node contact 10 inserted therebetween. Here, the storage node 5 faces the plate electrode 6 with the capacitor insulating film 11 inserted therebetween, thereby forming a capacitor of the DRAM. The storage node 5 is formed on the data transfer line 8, constituting a so-called COB (capacitor-on-bitline) structure.

Figure 6:
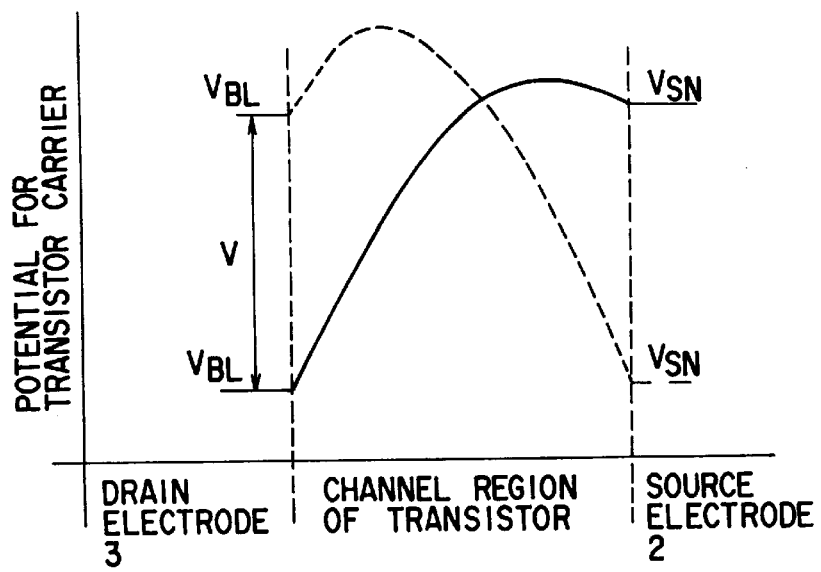
FIG. 6 is a graph showing potentials with respect to electrons of a transistor channel where the direction of a voltage is changed in the second embodiment.

A structural feature of the present embodiment is in that a layer (or $p^+$-type layer) 30 having a high impurity density and having a conductivity opposite to that of a conductive layer (or n-type layer) forming source and drain diffusion layers is selectively formed in the vicinity of a channel of the drain electrode 3 connected with the data transfer line 8. FIG. 6 shows a potential with respect to electrons of a transistor channel in case where the gate voltage is set to be equal to or lower than a threshold voltage and the direction of a voltage applied between source and drain electrodes is changed, in this structure.

When the voltage of the storage node 5 is set to be lower than the voltage of the data transfer line 8, a crest of the potential of a channel portion close to the drain electrode 3 connected to the data transfer line 8 can be increased much more. Therefore, where the threshold voltage of the cell transistor when a current flows from the drain electrode 3 to the source electrode 2 and the voltage of the storage node 5 is lower than the voltage of the data transfer line 8 is Vth1 and where the threshold voltage when a current flows in an opposite direction is Vth2, Vth1<Vth2 is satisfied under condition that the absolute value of a potential difference between the drain electrode 3 and the source electrode 2 is maintained to be equal. The asymmetry of the threshold voltages depends on the potential difference between the potentials applied between the source and drain. The asymmetry decreases as V comes closer to 0 and increases when V is large.

Figure 7A:
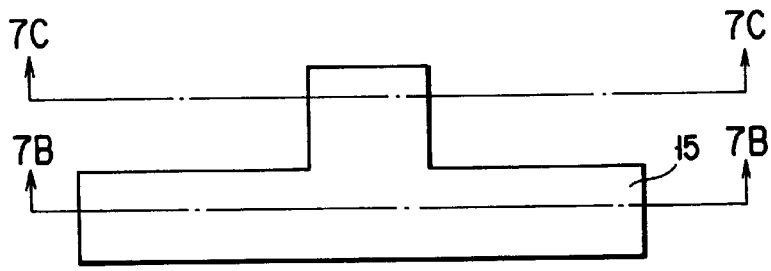
FIGS. 7A to 7C are a plan view and cross-sectional views showing a manufacturing step of the second embodiment.
Figure 7B:
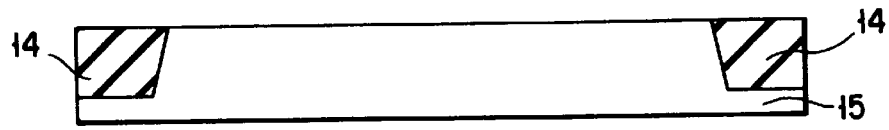
Figure 7C:
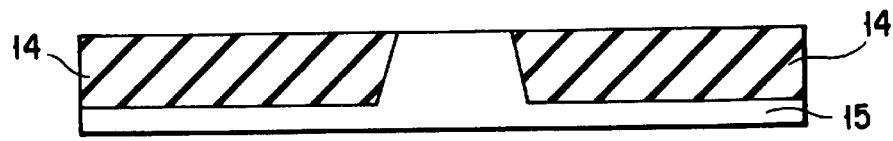

Next, manufacturing steps of the semiconductor structure of the present embodiment will be explained with reference to FIGS. 7A to 7C to FIGS. 14A to 14C. In FIGS. 7A to 14C, for example, FIGS. 7A to 7C are views showing manufacturing steps corresponding to FIGS. 4, 5B, and 5C, respectively.

At first, for example, a semiconductor substrate is prepared on which a p-type region 15 having a boron density $10^{15}$ cm$^{-3}$ is formed. Next, boron may be injected into a cell array region by ion implantation to obtain well-diffusion and the density of the p-type layer in the cell array region may be optimized. For example, the density may be $10^{15}$ cm$^{-3}$ to $10^{18}$ cm$^{-3}$. Subsequently, the surface of a semiconductor region 15 is oxidized to form a silicon oxide film having a thickness of 0.01 to 0.05 $\mu$m. Further, a silicon nitride film or a silicon film as a mask material for trench is deposited by a 0.03 to 0.5 $\mu$m.

Next, for example, an element isolation insulating film 14 made of a trench isolation. The depth of the trench isolation may be, for example, 0.1 to 2 $\mu$m, and an insulating film made, for example, a silicon oxide film is deposited by 0.1 to 4 $\mu$m after forming the trench for element isolation. Thereafter, other element isolation films than the trench are removed by etching back or polishing, such that the height falls within a range of ±0.3 $\mu$m of the height of the region 15. Next, the mask material of the trench is removed by reactive etching, for example, to obtain a shape as shown in FIGS. 7A to 7C. Subsequently, boron may be injected by ion-implantation to obtain well-diffusion, and the density of the p-type layer of the cell array region may be optimized.

Figure 8A:
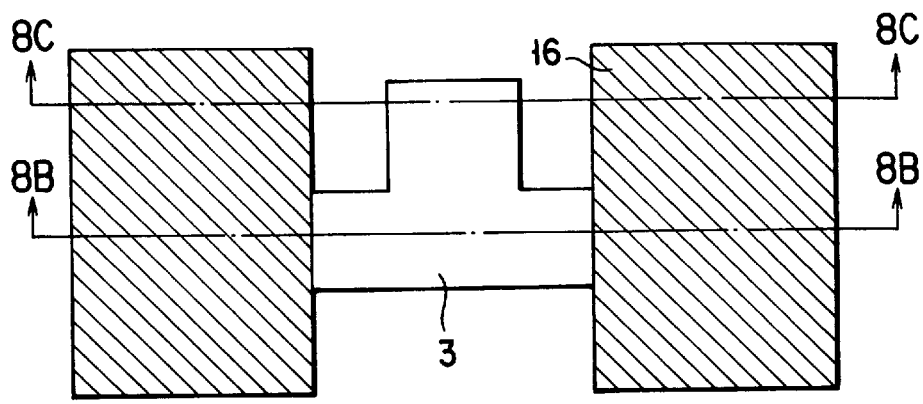
FIGS. 8A to 8C are a plan view and cross-sectional views showing a manufacturing step of the second embodiment.
Figure 8B:
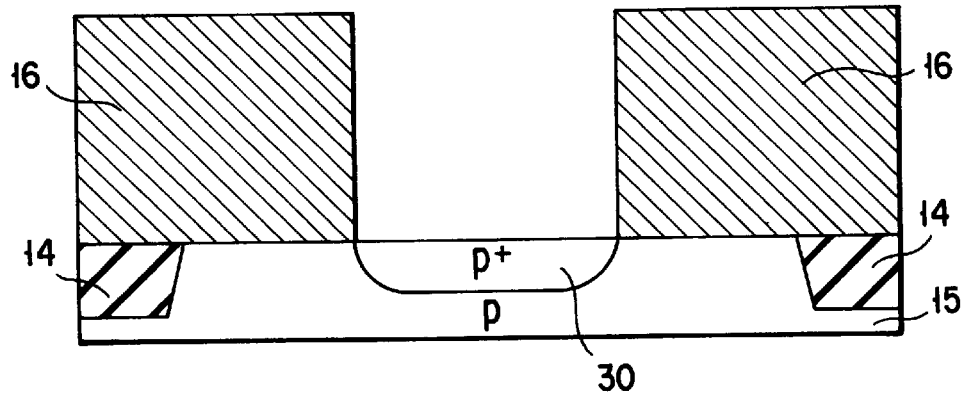
Figure 8C:
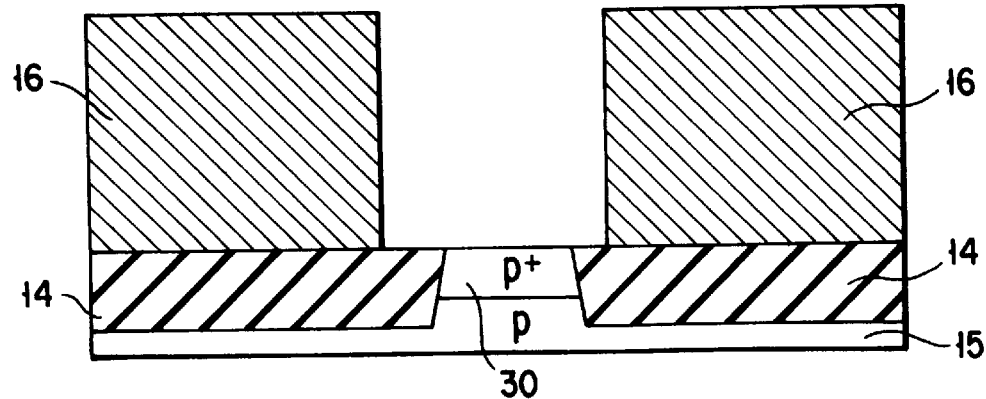

Next, to prepare a structure according to the present embodiment, for example, a resist 16 is applied as shown in FIGS. 8A to 8C, and lithography is carried out. Thereafter, for example, boron or $BF_2$ is injected by an amount of $10^{12}$ cm$^{-2}$ to $10^{15}$ cm$^{-2}$, to previously increase the density of the p-type substrate in the vicinity of the drain electrode 3 connected to the data transfer line, and a $p^+$-type layer 30 is formed. In a memory cell of a DRAM, threshold voltages to be set for are quite different between a cell portion and a peripheral circuit, so that formation of a well and a doping profile are normally carried out separately for a cell portion and a peripheral circuit portion. In a conventional case, when ion-implantation is performed for forming a doping profile for a peripheral portion, the entire surface of the cell portion is covered with a resist 16 so that this portion is not subjected to ion-implantation. However, in the present embodiment, peripheral lithography as described above is carried out for a cell portion as shown in FIGS. 8A to 8C at the same time, and therefore, a profile for impurities required for the present embodiment can be formed without increase the number of steps.

Next, the surface of the p-type semiconductor region 15 is oxidized or nitrided, for example, by 3 to 20 nm, to form a gate insulating film 12. Thereafter, a second polycrystal silicon film to form a gate electrode 7 is deposited on the entire surface, and $POCl_3$ diffusion is performed to lower the resistance of the polycrystal silicon film. Further, a silicon nitride film to form an insulating film 13a is deposited on the entire surface, and thereafter, processing by lithography and reactive ion-etching is performed to form a gate electrode 7. Further, for example, As is injected into the entire surface by ion-implantation to form n-type source and drain electrodes 2 and 3.

Figure 9A:
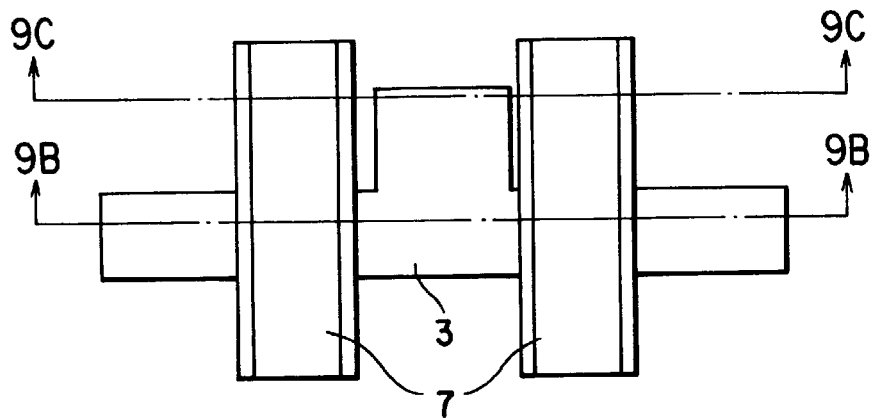
FIGS. 9A to 9C are a plan view and cross-sectional views showing a manufacturing step of the second embodiment.
Figure 9B:
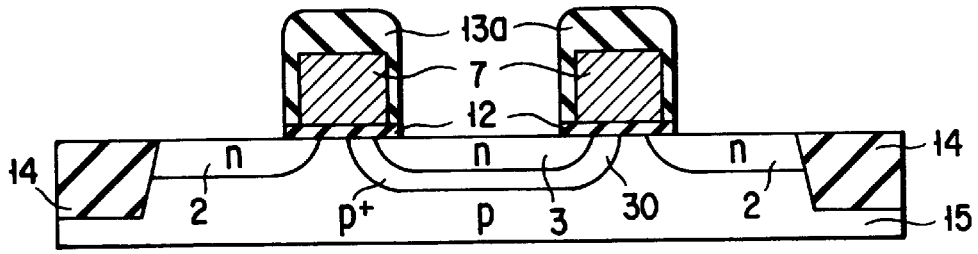
Figure 9C:
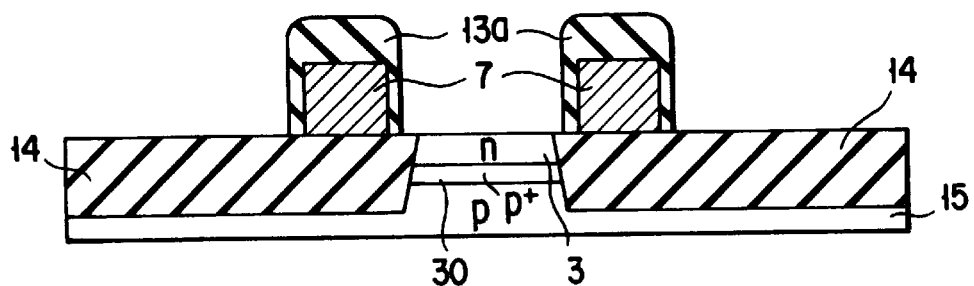
Figure 10A:
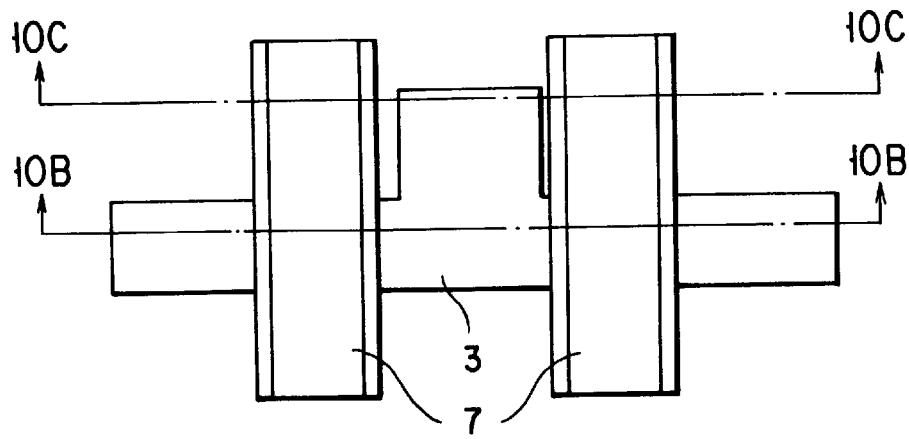
FIGS. 10A to 10C are a plan view and cross-sectional views showing a modification of the second embodiment.
Figure 10B:
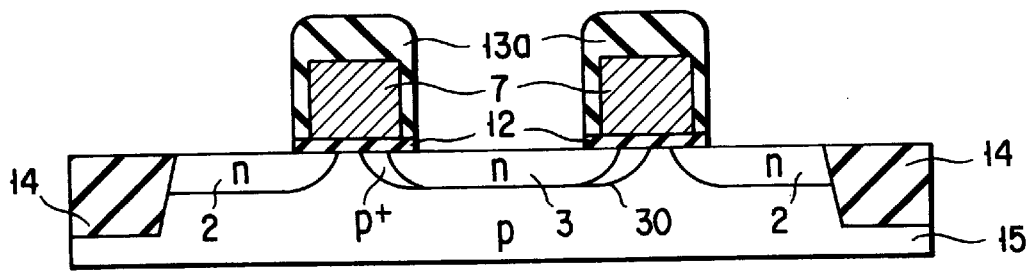
Figure 10C:
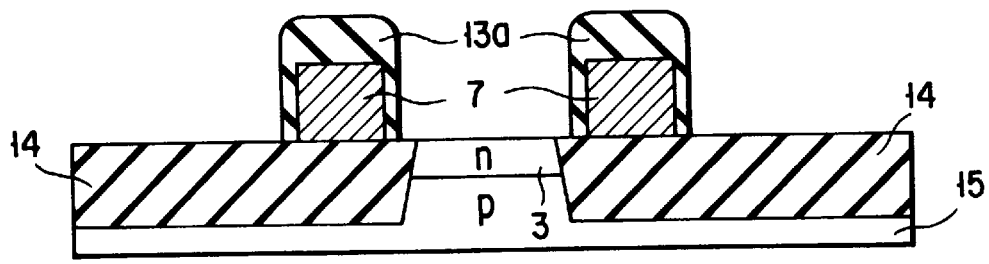
Figure 11A:
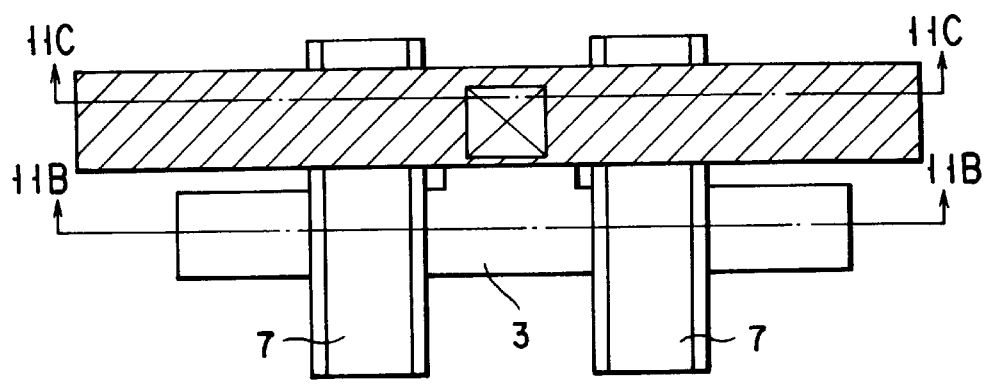
FIGS. 11A to 11C are a plan view and cross-sectional views showing a manufacturing step of the second embodiment.
Figure 11B:
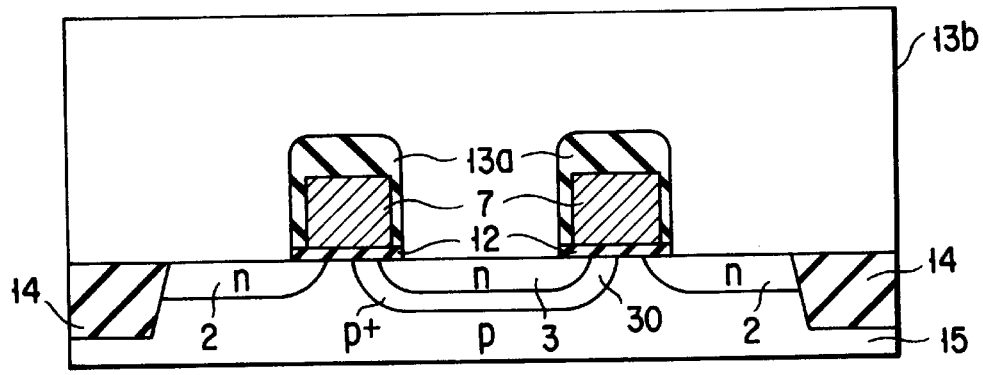
Figure 11C:
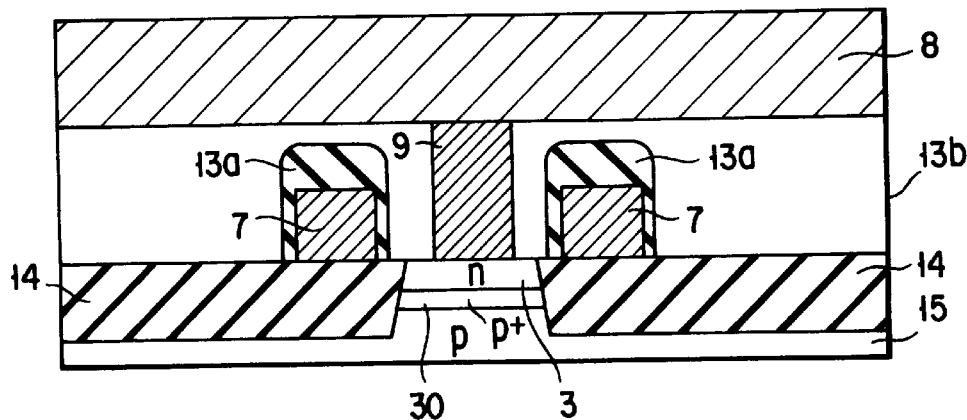

Subsequently, the silicon nitride film to form an insulating film 13a is further deposited on the entire surface, and an insulating film 13a is maintained on the sharp edged side wall of the gate electrode 7 by anisotropic etching, to form a side wall insulating film for the gate. Thus, a shape shown in FIGS. 9A to 9C is obtained. The side wall film and the silicon nitride film deposited immediately before the lithography surround the gate electrode 7, so that electric insulation from the data transfer line 8 can be easily maintained. Thereafter, in order to reduce the connection resistance between the data transfer line 8 and the n-type source and drain diffusion layers 2 and 3, for example, arsenic may be injected into the diffusion layers 2 and 3 by ion-implantation.

In the present embodiment, it is important that a $p^+$-type layer 30 is formed in a channel below a transistor gate 7, but the $p^+$-type layer 30 needs not be formed just below a drain diffusion layer 3.

Further, an interlayer insulating film 13b is deposited on the entire surface, and thereafter, a data transfer line contact 9 is formed by lithography and reactive ion-etching. Thereafter, for example, tungsten is deposited on the entire surface, and the data transfer line 8 is processed by lithography and reactive ion-etching, to obtain the shape shown in FIGS. 11A to 11C.

In further successive steps following the above step are not shown in the drawings, a storage node contact 10 is prepared by lithography and reactive ion-etching after the interlayer insulating film 13b is deposited. Thereafter, for example, Ru, $RuO_2$ or Pt is deposited and processed into a storage node 5 by lithography and reactive ion-etching. Further, a capacitor insulating film 11 made of BaSrTiO and a plate electrode 6 made of Pt are deposited to form and complete an upper wiring layer.

Figure 12A:
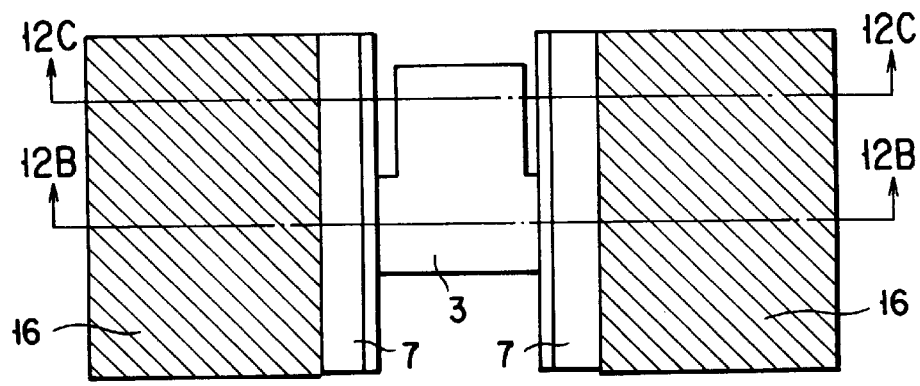
FIGS. 12A to 12C are a plan view and cross-sectional views showing a modification of the second embodiment.
Figure 12B:
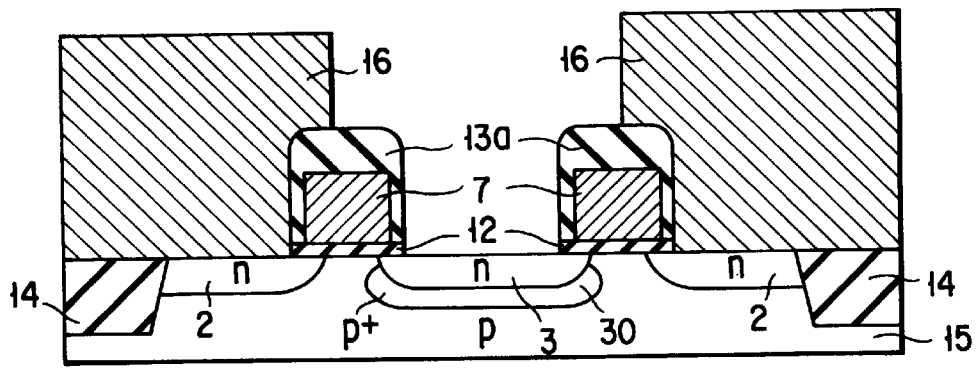
Figure 12C:
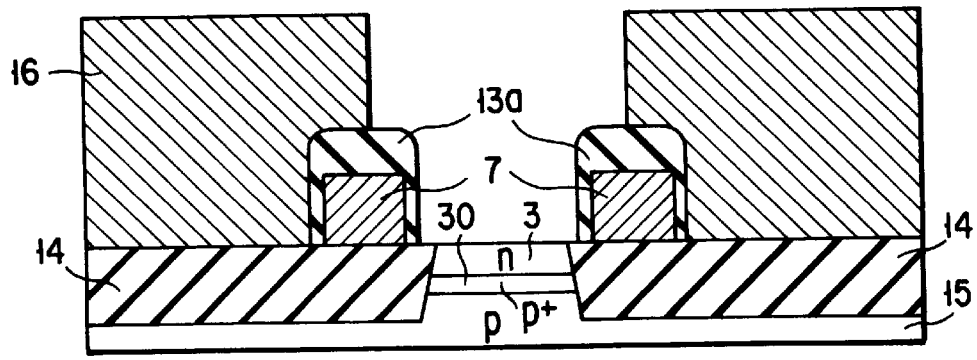

Here, the $p^+$-type layer 30 may be prepared in a manner in which a resist 16 is applied to perform lithography and, for example, boron or $BF_2$ is injected thereto by $10^{12}$ cm$^{-2}$ to $10^{15}$ cm$^{-2}$ by ion-implantation to raise the density of the p-type substrate in the vicinity of the drain electrode connected to the data transfer line 8, as shown in FIGS. 12A to 12C, in place of the step shown in FIGS. 8A to 8C. In this case, p+-type layer 30 is formed without misalignment with respect to the gate, resulting in an advantage that the position of the $p^+$-type layer 30 from the gate end can be easily controlled and the threshold voltage can therefore be easily controlled. Further, since no heat processing steps are carried out, diffusion which will be caused by a heat of ions can be reduced and a much sharper doping profile can be formed.

Note that a $p^+$-type layer 30 formed by ion-implantation does not reach a substrate—gate insulating film interface, as shown in FIG. 12B. However, the threshold voltage is asymmetric in relation to the arrangement direction of the source and drain, as long as an depletion layer reaches the $p^+$-layer 30.

Figure 13A:
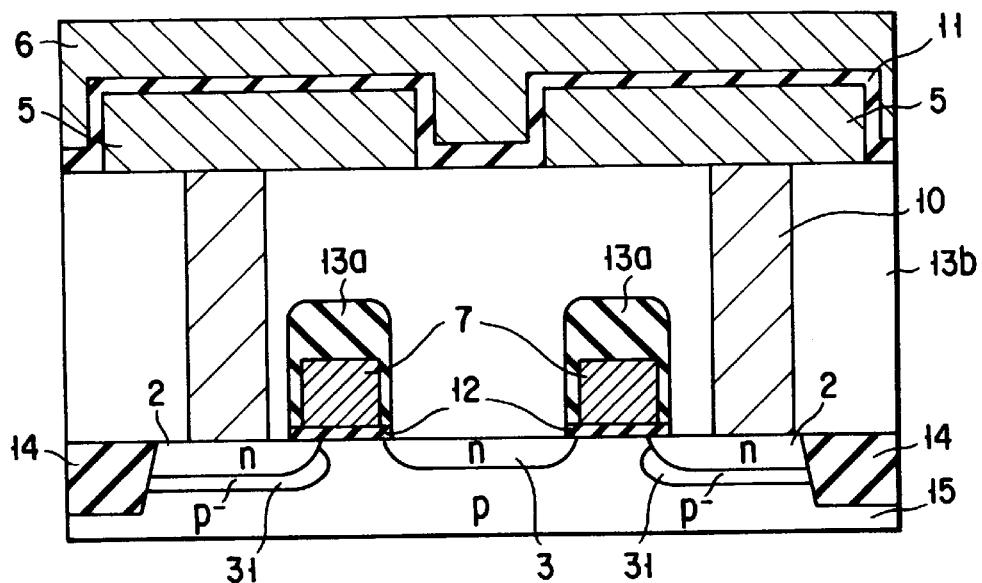
FIGS. 13A and 13B are cross-sectional views showing a modification of the second embodiment.
Figure 13B:
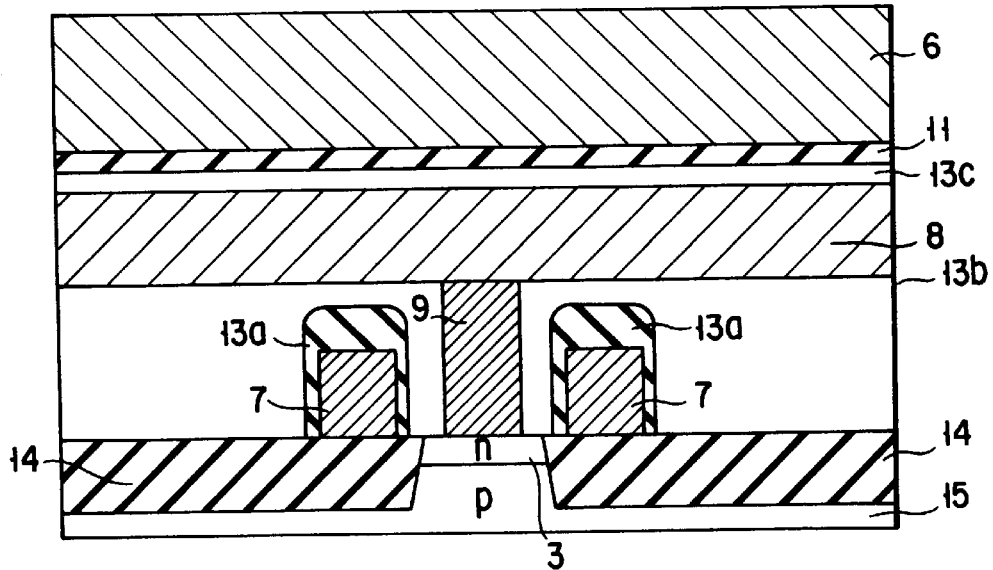

A modification of the present embodiment will be a method in which a $p^-$-type layer 31 having a lower impurity density than the substrate and a conductivity opposite to the conductive layer (n-type) in which source and drain layers are selectively formed is formed in a channel portion close to the source diffusion layer 2 connected to the storage node 5, in place of a $p^+$-type layer 30, as shown in FIGS. 13A and 13B. FIGS. 13A and 13B do not show plan views but correspond to cross-sectional views along lines 5A—5A and 5B—5B, respectively, like in FIG. 4.

Figure 14A:
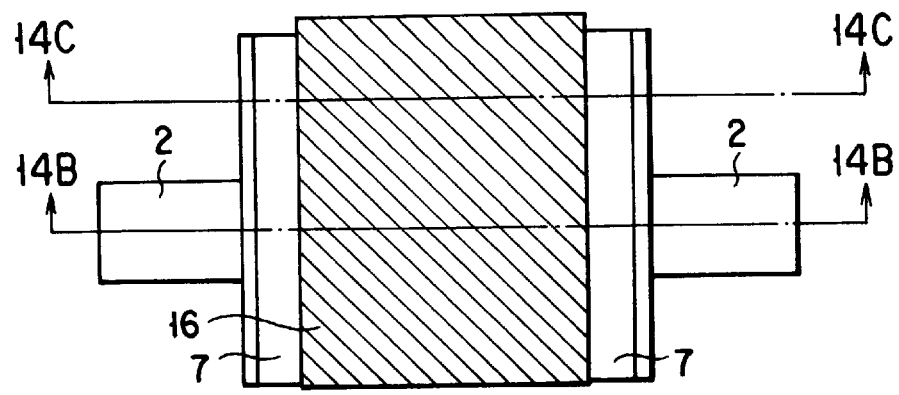
FIGS. 14A to 14C are a plan view and cross-sectional views showing a manufacturing step which realizes the structure shown in FIGS. 13A and 13B.
Figure 14B:
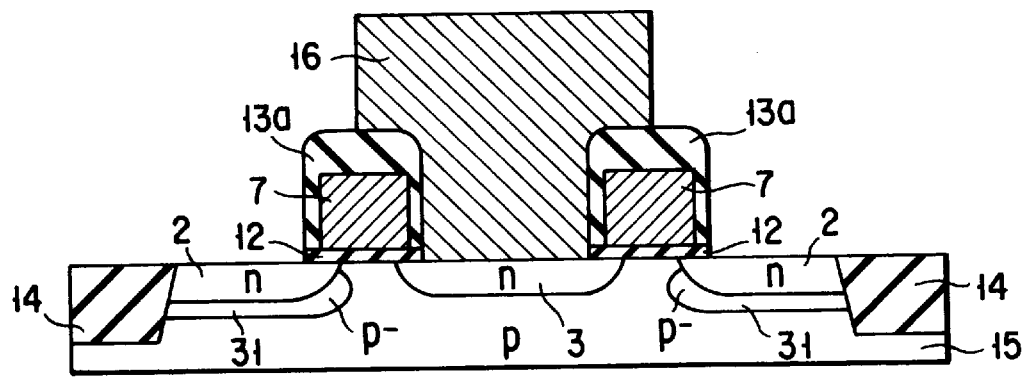
Figure 14C:
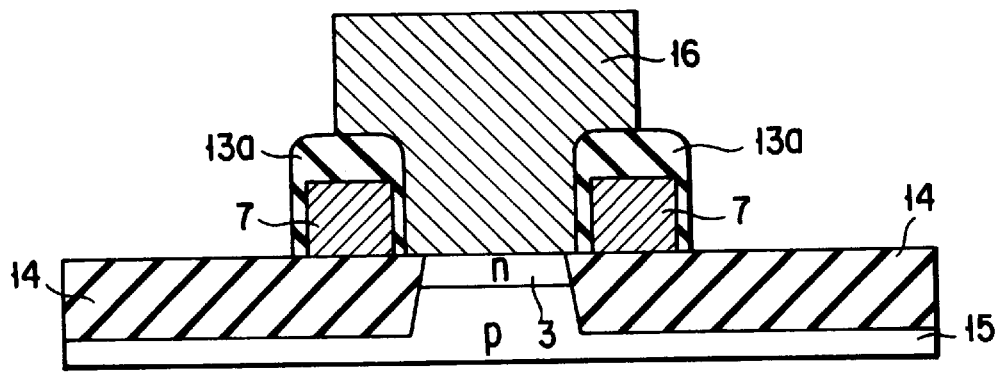

The step of forming the $p^-$-type layer 31 is the same as that of forming a $p^+$-type layer 30. For example, as shown in FIGS. 14A to 14C, source and drain diffusion layers 2 and 3 are formed, and thereafter, an opening is provided in the resist 16 above a portion where the $p^-$-type layer 31 should be formed, so as to inject an n-type ion seed such as As or P. In this manner, the density of the p-type layer at this portion can be lowered.

In the present embodiment, the density of the p-type layer at the channel portion close to the drain electrode 3 connected to the data transfer line 8 is set to be higher than the density of the channel portion close to the source electrode 2 connected to the storage node 5. Therefore, not only the relation of Vth1<Vth2 is satisfied, but also the depletion layer region prepared by the drain electrode 3 can be reduced to be small. As a result, it is possible to reduce an effect that a pair of an electron and a plus hole caused by a particle line such as a α-ray inputted into the vicinity of the drain electrode 3 is collected by the drain electrode 3. In this manner, soft errors are difficult to occur in a bit line mode.

Further, in the present embodiment, the density of the p-type layer of the channel portion close to the source electrode 2 connected to the storage node 5 is set to be lower than the density of the channel portion close to the drain electrode 3 connected to the data transfer line 8. It is possible to restrict a tunnel leakage current which increases as the boron density of the substrate increases, so that the data holding time of a cell can be elongated much more. Further, since the substrate density is low, the substrate impurity amount of impurities contained in an depletion layer can be reduced so that the substrate bias effect can be electric field is concentrated at an edge portion at the boundary between the element isolation and the transistor region, the threshold voltage decreases. Therefore, by using this kind of transistor, the effect at the edge portion is increased as the width of the transistor decreases, so that it is possible to realize, with ease, a transistor in which the threshold voltage decreases as the channel width decreases.

In manufacturing steps thereof, a semiconductor substrate in which a p-type semiconductor region 15 having a boron density of $10^{15}$ cm$^{-3}$ is formed is prepared. Next, boron may be injected to the cell array region by ion-implantation to obtain well-diffusion to optimize the density of the p-type layer of the cell array region. For example, the density may be $10^{15}$ cm-3 to $10^{18}$ cm$^{-3}$. Subsequently, the surface of a semiconductor region 15 is oxidized to form a silicon oxide film having a thickness of 0.01 to 0.05 μm. Further, a silicon nitride film or a silicon film as a mask material for trench is deposited by a 0.03 to 0.5 μm.

Next, for example, an element isolation 14 in form of a trench isolation is formed. The depth of the trench isolation may be, for example, 0.1 to 2 μm, and an insulating film made of, for example, a silicon oxide film is deposited by 0.1 to 4 μm after forming the trench for element isolation. Thereafter, other reduced. As a result of this, the electric field applied to a gate insulating film can be reduced to be small, so that the reliability of a gate insulating film can be improved much more.

Third Embodiment

Figure 15:
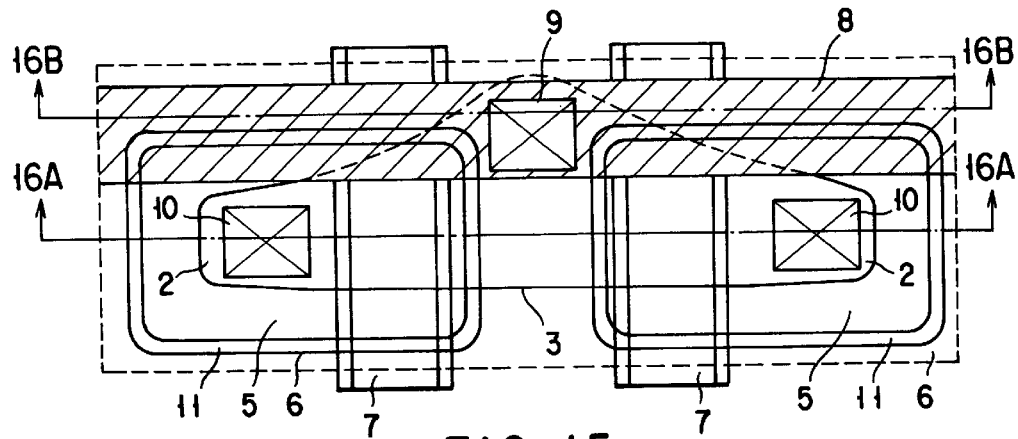
FIG. 15 is a plan view showing a cell portion of a COB-type DRAM according to a third embodiment.
Figure 16A:
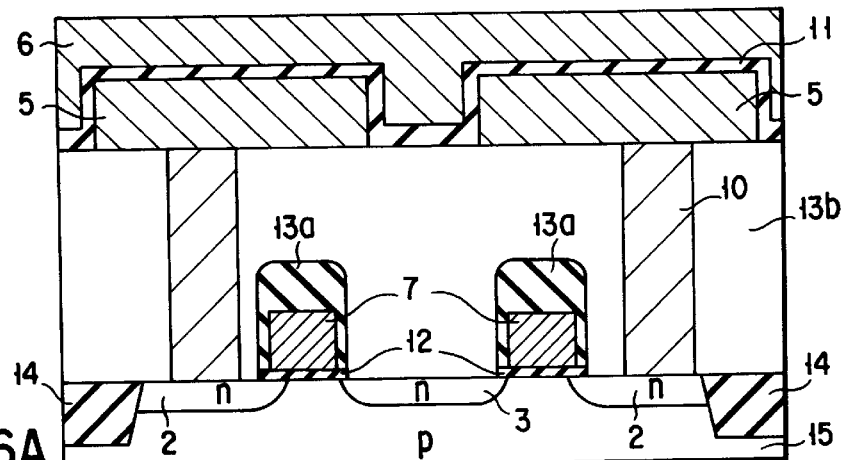
FIGS. 16A and 16B are cross-sectional views cut along lines 16A—16A and 16B—16B in FIG. 15.
Figure 16B:
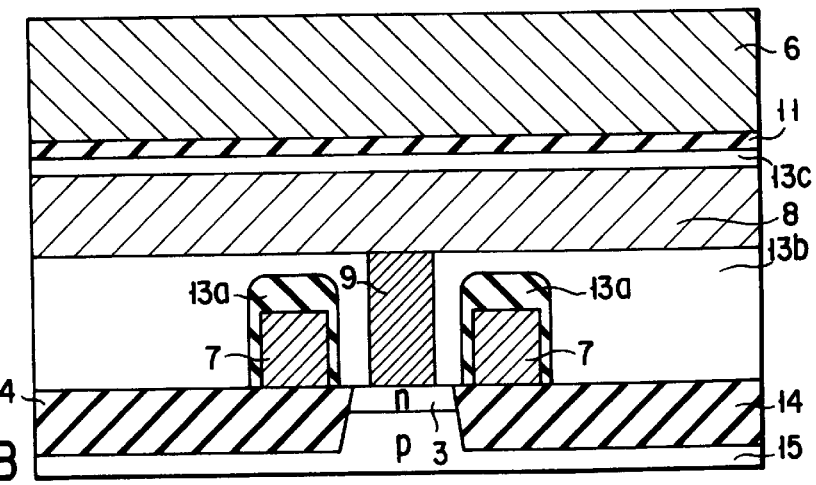

FIG. 15 is a plan view of a COB-type DRAM according to a third embodiment of the present invention. FIGS. 16A and 16B are respectively cross-sectional views cut along lines 16A—16A and 16B—16B in FIG. 15. Note that the same portions as those in FIGS. 4 and 5A and 5B are referred to by the same reference symbols and detailed explanation thereof will be omitted herefrom.

Figure 17:
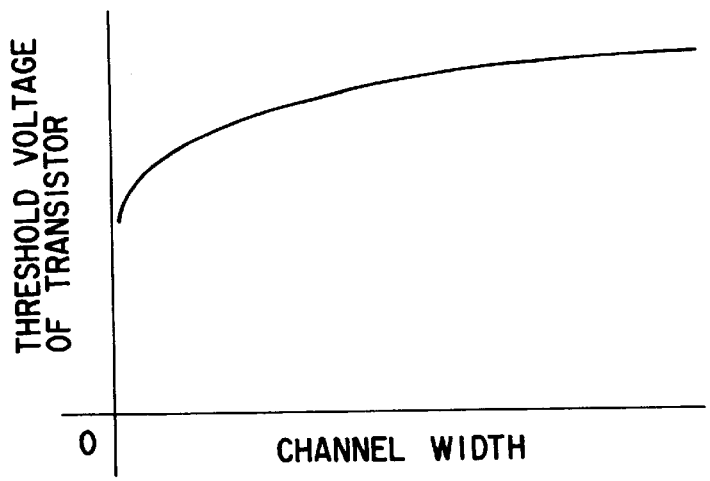
FIG. 17 is a graph showing a relationship between a channel width and a threshold voltage, which is satisfied by a transistor according to the third embodiment.

The present embodiment is basically similar to the second embodiment, except that the shape of the transistor region is different from that of the second embodiment. Below the gate electrode 7, the width of the transistor region close to the drain electrode 3 connected to the data transfer line contact 9 is wider than the width of the transistor region of the portion close to the source electrode 3 connected to the storage node contact 10. The relationship between the threshold voltage of the transistor and the channel width must be such that the threshold voltage decreases as the width decreases, as shown in FIG. 17.

Figure 18A:
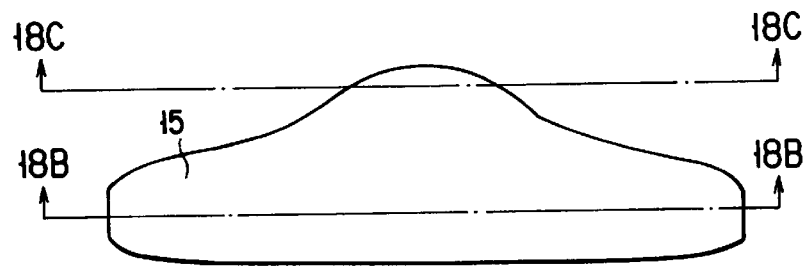
FIGS. 18A to 18C are a plan view and cross-sectional views showing a manufacturing step of the third embodiment.
Figure 18B:
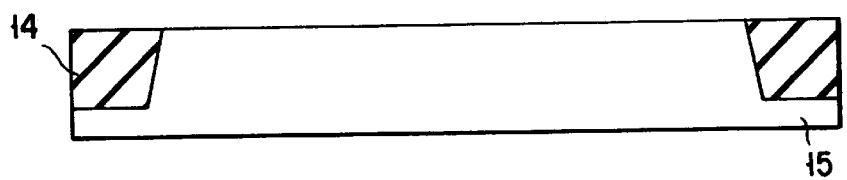
Figure 18C:
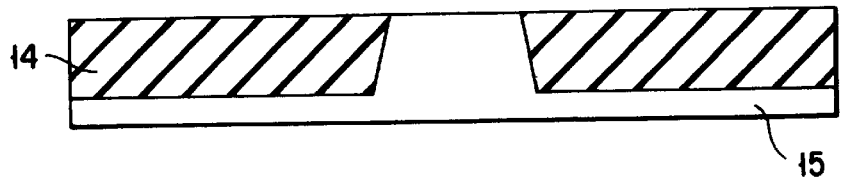

For example, in a transistor using trench isolation for element isolation, since the gate portions than the element isolation are removed by etching back or polishing, such that the height falls within a range of ±0.3 μm with respect to the height of the region 15. Next, the mask material of the trench is removed by reactive etching, for example, to obtain a shape as shown in FIGS. 18A to 18C. Subsequently, boron may be injected by. ion-implantation to obtain well-diffusion, and the density of the p-type layer of the cell array region may be optimized. The other remaining manufacturing steps are the same as those of the second embodiment subsequent to the gate formation step thereof, except for the step of forming a p$^+$-type layer 30, and therefore, explanation of those steps will be omitted.

According to the present embodiment, it is possible to realize the relation of Vth1<Vth2 without increasing the number of steps, unlike in the second embodiment. In addition, the present embodiment is different from the second embodiment in that neither a diffusion capacitance nor an increase of a leakage current is caused by formation of a p$^+$-type layer 30 of the source/drain electrodes 3. Further, even if the data transfer line contact 9 is shifted and misaligned in the direction in which the gate control line 7 extends, the drain region 3 where the data transfer line contact 9 should be formed can be maintained to be wide. Thus, it is possible to form a data transfer line contact 9 which can respond to a misalignment of the data transfer line contact 9 and maintain the contract connection resistance to be low.

Fourth Embodiment

Figure 19:
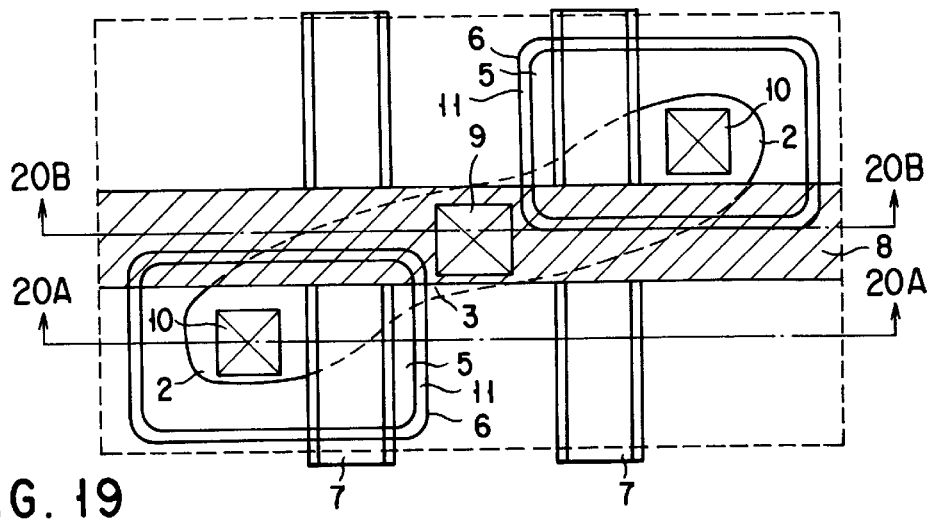
FIG. 19 is a plan view showing a cell portion of a COB-type DRAM according to a fourth embodiment.
Figure 20A:
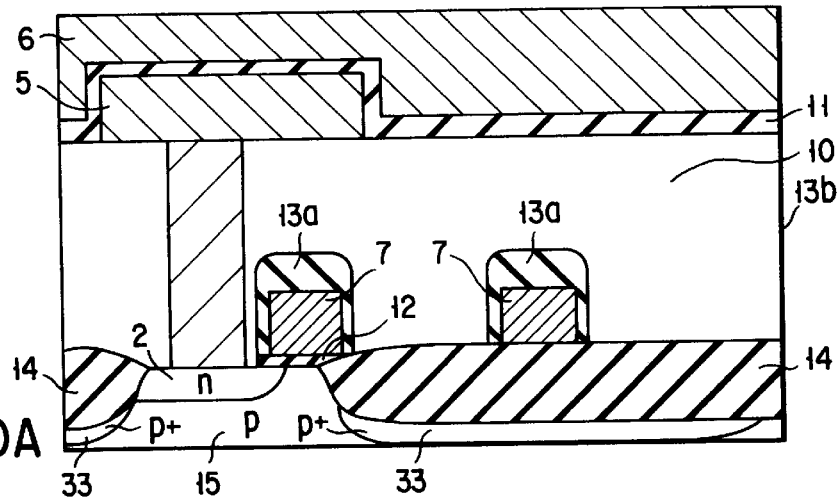
FIGS. 20A and 20B are cross-sectional views cut along lines 20A—20A and 20B—20B in FIG. 19.
Figure 20B:
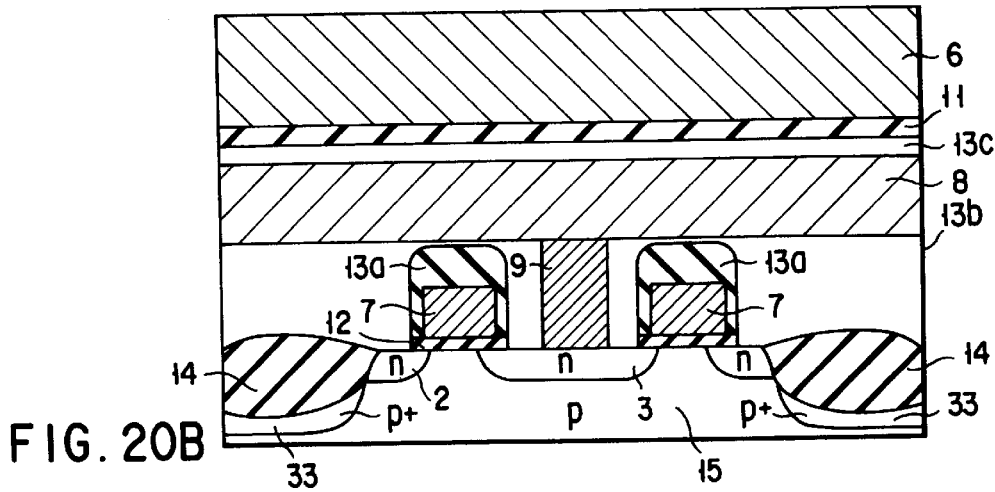
Figure 21:
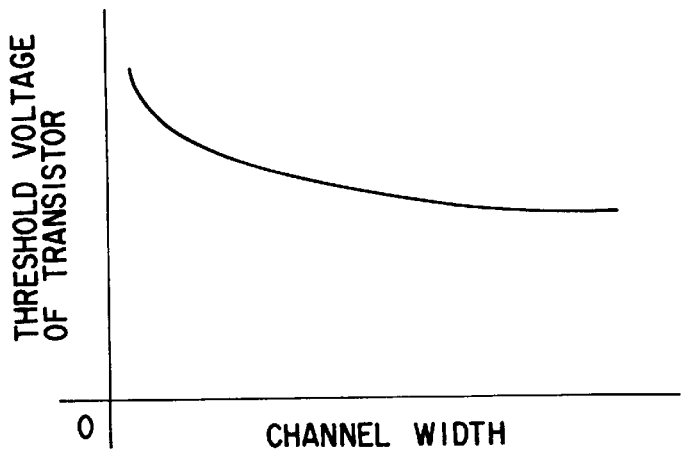
FIG. 21 is a graph showing a relationship between a channel width and a threshold voltage, which is satisfied by a transistor according to the fourth embodiment.

FIG. 19 is a plan view showing a cell portion of a COB-type DRAM according to a fourth embodiment of the present invention. FIGS. 20A and 20B are respectively cross-sectional views cut along lines 20A—20A and 20B—20B in FIG. 19. Note that the same portions as those in FIGS. 4 and 5A and 5B are referred to by the same reference symbols and detailed explanation thereof will be omitted herefrom.

The present embodiment is basically similar to the third embodiment, except that the shape of the transistor region is different from that of the second embodiment. The present embodiment is characterized in that the width of the portion close to the drain electrode 3 connected to the data transfer line contact 9 is norrower than the width of the transistor region of the portion close to the source electrode 3 connected to the storage node contact 10, below the gate electrode 7, as is indicated by a broken line showing the shape of the transistor region in FIG. 19. The relationship between the threshold voltage of the transistor and the channel width must be such that the threshold voltage increases as the width decreases, as shown in FIG. 17, on the contrary to the third embodiment.

Such a transistor having a threshold voltage, which increases as the width decreases, can be prepared in the following manner. For example, in a transistor whose element isolation region is subjected to ion-implantation for injecting field ions to prevent punch-through, the field ions thus injected diffuse in the channel region, so that the threshold voltage increases as the channel width decreases. In addition, in case of a shallow element isolation shape formed by a LOCOS method or an improved LOCOS method, the gate electric field reaches a semiconductor region below an element isolation portion and a corresponding portion must be depleted, so that the threshold voltage increases as the channel width decreases.

In manufacturing steps thereof, a substrate in which a p-type semiconductor region 15 having a boron density of $10^{15}$ cm$^{-3}$ is formed is prepared. Next, boron may be injected to the cell array region by ion-implantation to obtain well-diffusion to optimize the density of the p-type layer of the cell array region. For example, the density may be $10^{15}$ cm$^{-3}$ to $10^{18}$ cm$^{-3}$. Subsequently, the surface of a semiconductor region 15 is oxidized to form a silicon oxide film having a thickness of 0.01 to 0.05 μm. Further, a silicon nitride film or a silicon film as a mask material of a LOCOS separation is deposited by a 0.03 to 0.5 μm.

Next, for example, an element isolation 14 in form of a LOCOS isolation is formed. Firstly, for example, the silicon nitride film as a mask material is removed at an element isolation portion, and thereafter, the semiconductor region 15 is oxidized at a temperature of 1000 to 1200° C. for example, in an oxidation atmosphere of H$_2$O or the like, to obtain an element isolation insulating film 14. Thereafter, the mask material for the LOCOS isolation is removed by reactive etching, for example. In order to prevent punch-through below the field oxidation film Before or after oxidation, boron ions are injected by $10^{12}$ cm$^{-2}$ to $10^{14}$ cm$^{-2}$, thereby to form a p$^+$-type punch-through protect layer 33. In addition, the silicon nitride film as the mask material is removed at the element isolation portion by lithography and etching, and thereafter, for example, the substrate is etched by about 0.05 to 1 μm to form a groove.

Subsequently, boron may be injected by ion-implantation to obtain well-diffusion, and the density of the p-type layer of the cell array region may be optimized. The other remaining manufacturing steps are the same as those of the second embodiment subsequent to the gate formation step thereof, except for the step of forming a p$^+$-type layer 30, and therefore, explanation of those steps will be omitted herefrom.

According to the present embodiment, it is possible to realize the relation of Vth1<Vth2 without increasing the number of steps, like in the third embodiment, and the diffusion capacitance of the drain electrode is not increased, so that the capacitance of the data transfer line 8 can be reduced to be small. Further, since the source region 2 with respect to the contact 10 of the storage node 5 can be maintained to be wide, it is possible to form a contact 10 which maintains a low connection resistance with respect to the storage node 5.

Fifth Embodiment

Figure 22:
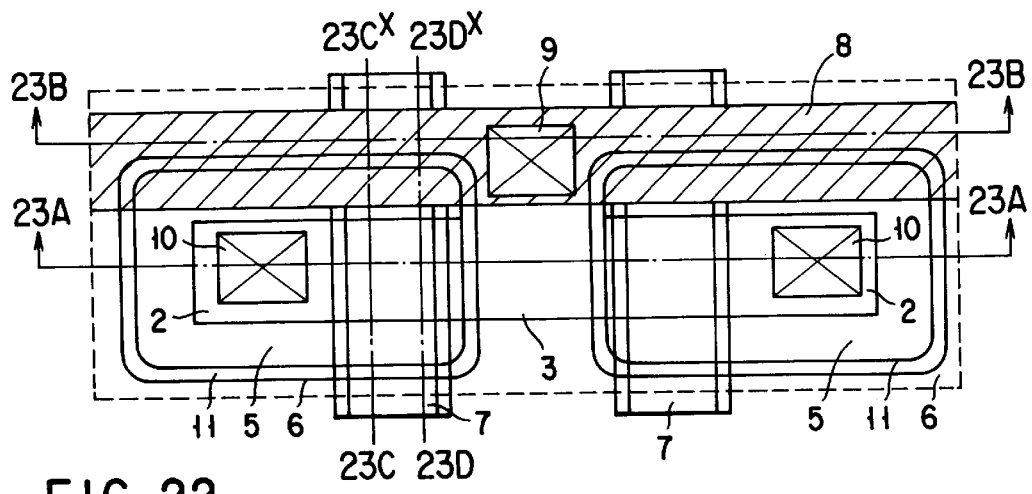
FIG. 22 is a plan view showing a cell portion of a COB-type DRAM according to a fifth embodiment.
Figure 23A:
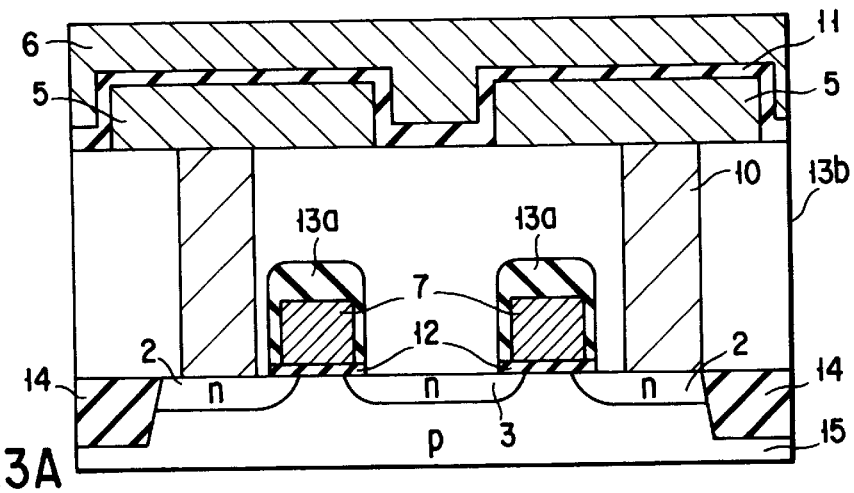
FIGS. 23A to 23D are cross-sectional views cut along lines 23A—23A, 23B—23B, 23C—23C, and 23D—23D in FIG. 22.
Figure 23B:
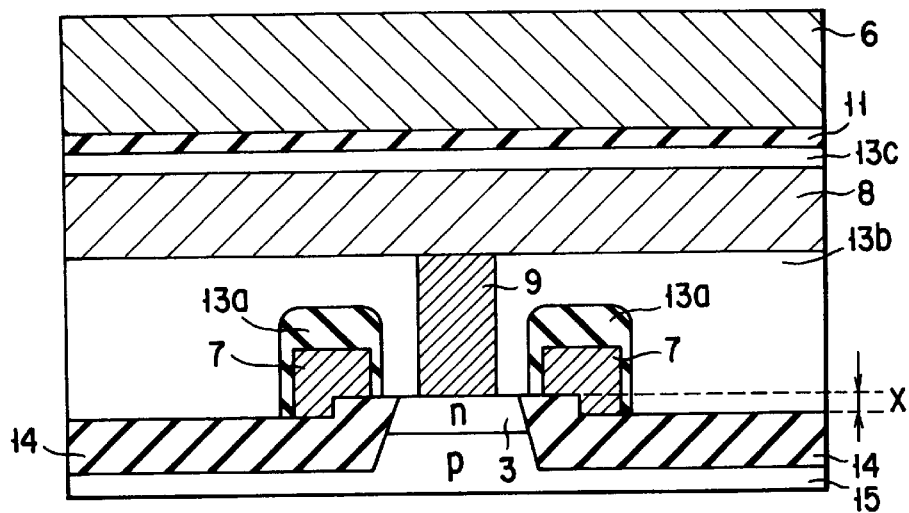
Figure 23C:
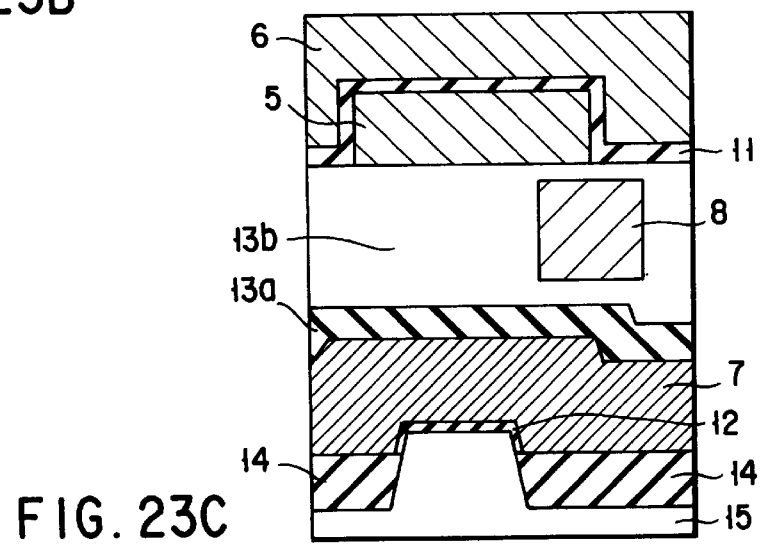
Figure 23D:
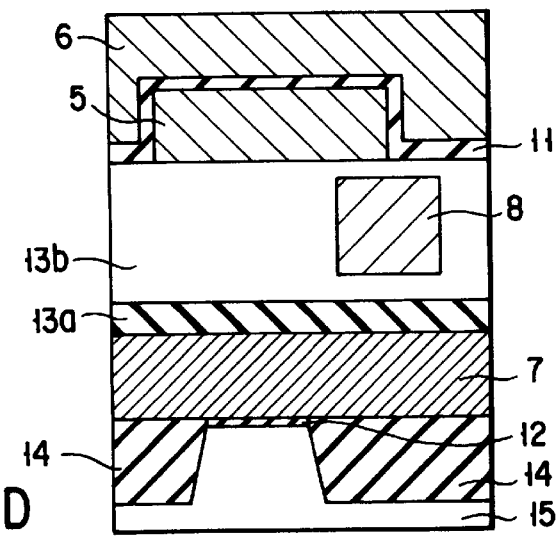

FIG. 22 is a plan view showing a cell portion of a COB-type DRAM according to a fifth embodiment of the present invention. FIGS. 23A to 23D are respectively cross-sectional views cut along lines 23A—23A, 23B—23B, 23C—23C, and 23D—23D in FIG. 22. Note that the same portions as those in FIGS. 4 and 5A and 5B are referred to by same reference symbols and detailed explanation thereof will be omitted herefrom.

The present embodiment is basically similar to the third embodiment, except that the shape of the transistor region is different from that of the second embodiment. In the present embodiment, the shape of the transistor region below the gate electrode 7, which is arranged such that the height of the main plane of the gate insulating film and the semiconductor channel of the MISFET from the interface between the element isolation insulting film 14 and the gate electrode 7 in the side surface of the MISFET close to the drain electrode 3 connected to the data transfer line contact 9 is greater than the height from the interface between the element isolation insulating film 14 and the gate electrode 7 in the side surface of the MISFET close to the source electrode 2 connected to the storage node contact 10.

Here, in a transistor using a trench isolation as an element isolation, since the gate electric field is concentrated at an edge portion on the boundary between the element isolation and the transistor region, the threshold voltage decreases as the height from the interface between the element isolation insulting film 14 and the gate electrode 7. Therefore, with use of this kind of transistor, it is possible to realize easily a transistor which satisfies a relation of Vth1<Vth2.

Figure 24A:
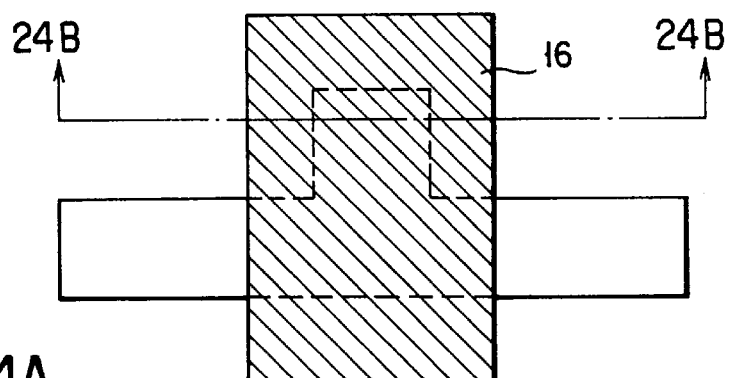
FIGS. 24A and 24B are a plan view and cross-sectional views showing a manufacturing step of a fifth embodiment.
Figure 24B:
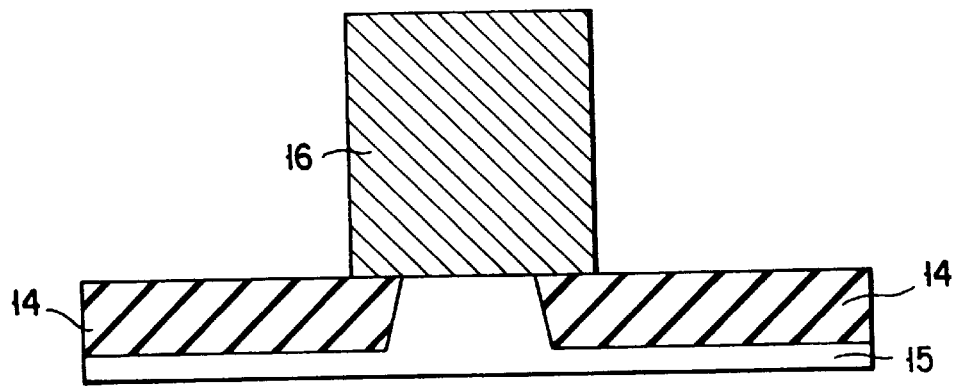
Figure 25A:
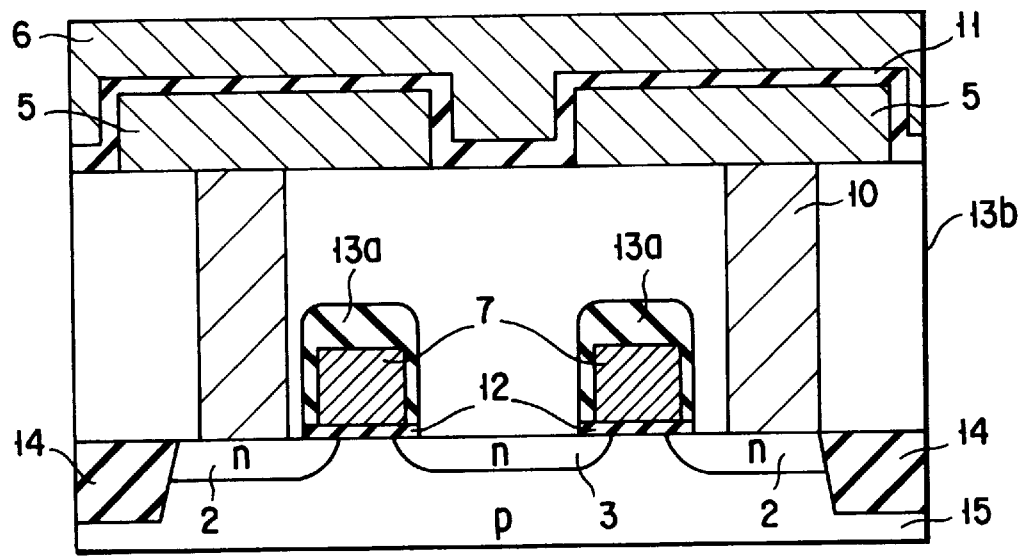
FIGS. 25A to 25D are cross-sectional views showing a modification of the fifth embodiment.
Figure 25B:
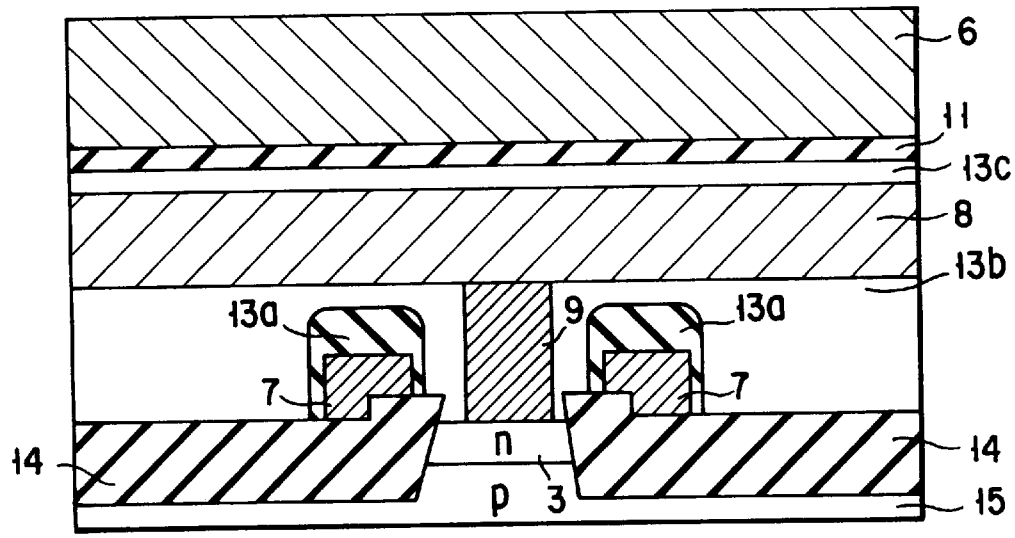
Figure 25C:
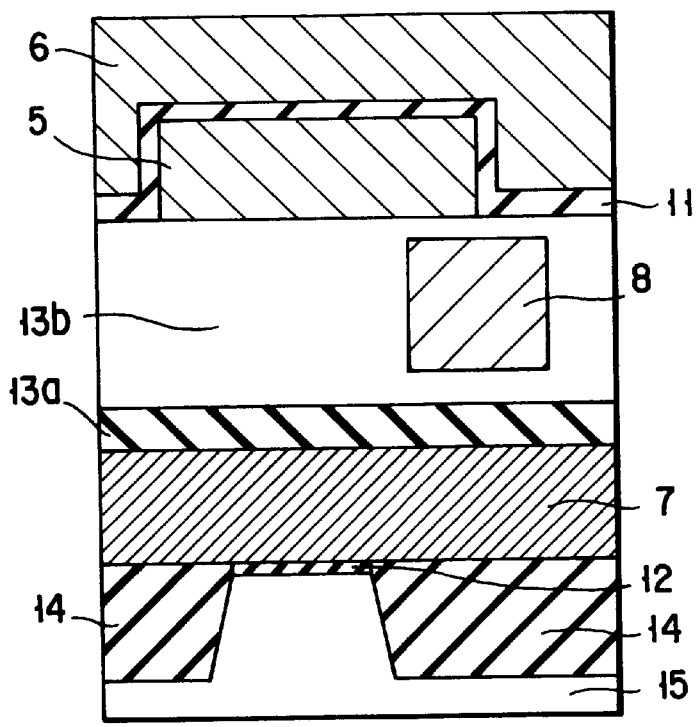
Figure 25D:
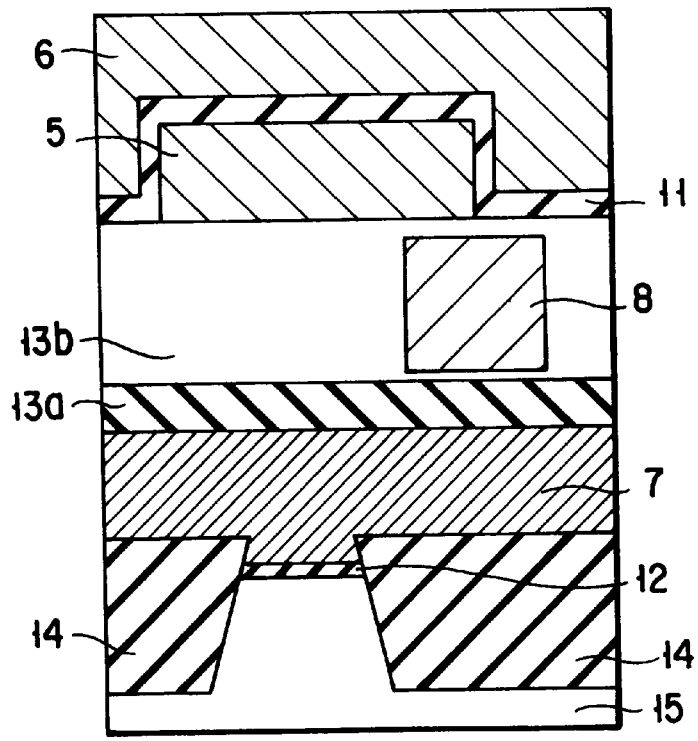

In manufacturing steps thereof, an element isolation insulating film 14 is formed as shown in FIGS. 24A and 24B, like in the second embodiment, and thereafter, lithography is carried out by covering the transistor region close to the drain electrode 3 connected to the data transfer line contact 9, with a resist 16. Further, the element isolation insulating film 14 is removed by a fluoride acid $NF_4F$ solution or ion etching, for example, as shown in FIG. 24B. The depth to which the film is removed is shallower than the element isolation depth and is, for example, about 0.01 to 0.20 $\mu$m. Thereafter, the resist 16 is removed by ashing or an organic solvent.

In place of the method thus using lithography, for example, the pattern dependency equivalent to the thickness of the element isolation insulating film 14 may be used to form a gap. This method can be easily realized in a case that the decomposed film is a supply rate-determining condition, by making a pattern arrangement shown in FIG. 32 explained later, with use of a phenomenon that the element isolation deposition film thickness becomes thin at the portion having a narrow trench width.

The other remaining manufacturing steps are the same as those of the second embodiment subsequent to the gate formation step thereof, except for the step of forming a $p^+$-type layer 30, and therefore, explanation of those steps will be omitted herefrom. There may be a modification of the present embodiment in which the element isolation insulating film 14 is higher than the semiconductor region 15, as shown in FIGS. 25A to 25D. In this case, same advantages are obtained. Note that such a modification can be shown in the same plan view as shown in FIG. 22, and the plan view will be omitted herefrom.

In the present embodiment, it is not necessary to change the width of a transistor, but the threshold voltage can be controlled by adjusting the etching amount of the element isolation insulating film 14. Therefore, the planar patter of the present embodiment allows a greater degree of freedom in comparison with the third and fourth embodiments. As a result, the threshold voltage can be controlled without sacrificing planar design dimensions and lithography resolution.

Sixth Embodiment

Figure 26A:
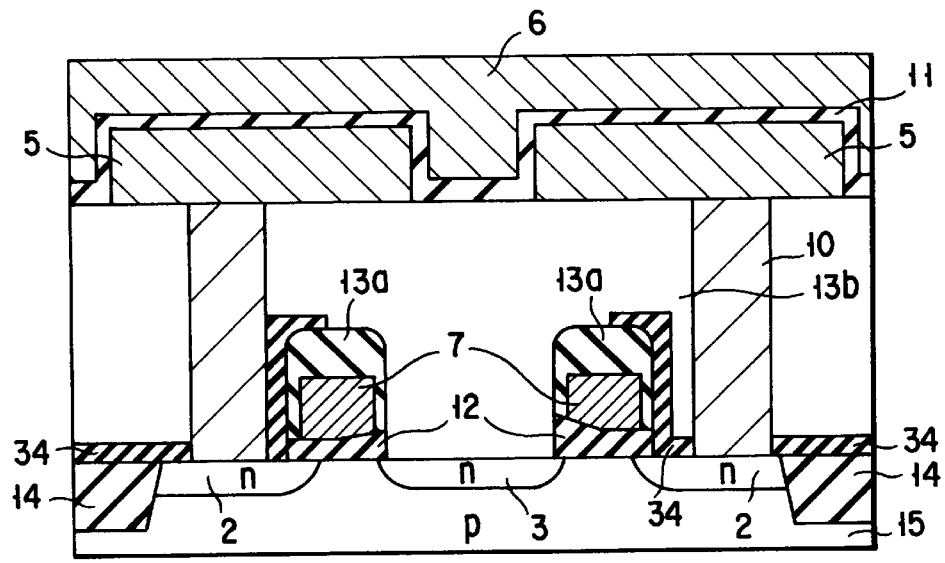
FIG. 26A and 26B are cross-sections of a cell portion of a COB-type DRAM according to a sixth embodiment.
Figure 26B:
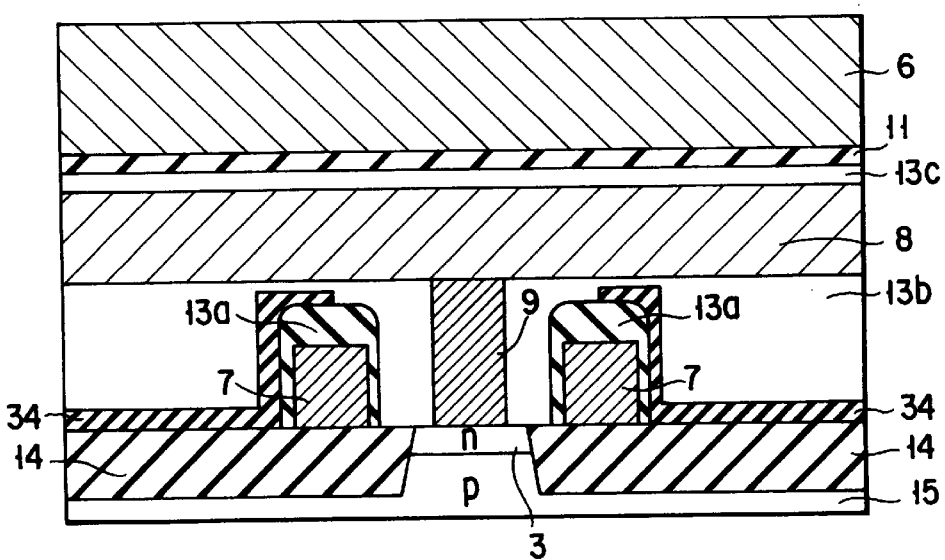

FIGS. 26A and 26B are cross-sectional views of a cell portion of a COB-type DRAM according to a sixth embodiment of the present invention. The present embodiment has the same plan view as shown in FIG. 4. FIGS. 26A and 26B respectively correspond to cross-sectional views cut along lines 5A—5A and 5B—5B in FIG. 4. Note that the same portions as those shown in FIGS. 4 and 5A and 5B are referred to by same reference symbols, and detailed explanation thereof will be omitted herefrom.

The present embodiment is basically similar to the second embodiment, except that the shape of the transistor region is different from that of the second embodiment. The present embodiment is characterized in that the thickness of a portion of the gate insulating film 12 close to the drain electrode 3 connected to the data transfer line contact 9 is greater than the thickness of a portion of the gate insulating film 12 close to the source electrode 2 connected to the storage node contact 10. As the thickness of the gate insulating film 12 increases, the voltage applied to the gate 7 is harder to reach the channel of the transistor and the threshold voltage increases. Accordingly, with use of such a transistor, it is possible to realize easily a transistor which satisfies a relation of Vth1<Vth2.

Figure 27A:
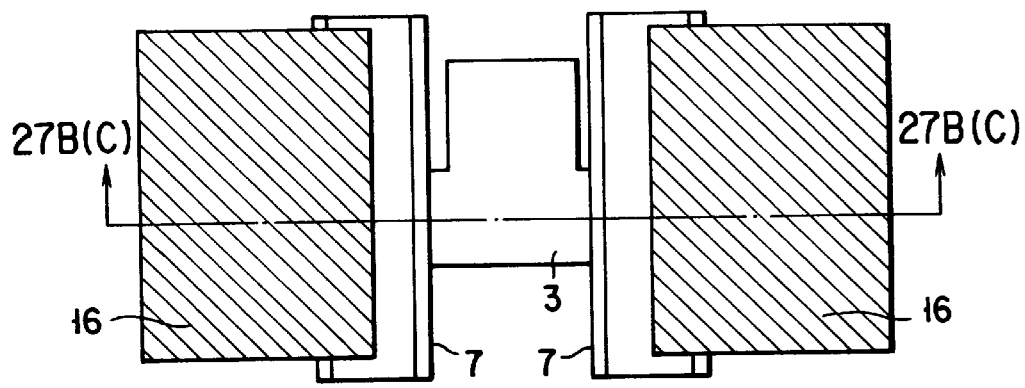
FIGS. 27A to 27C are a plan view and cross-sectional views showing a manufacturing step of the sixth embodiment.
Figure 27B:
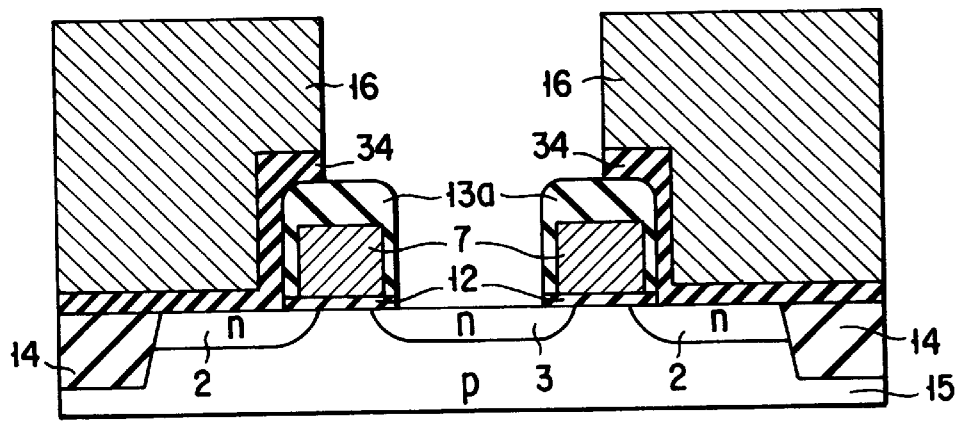
Figure 27C:
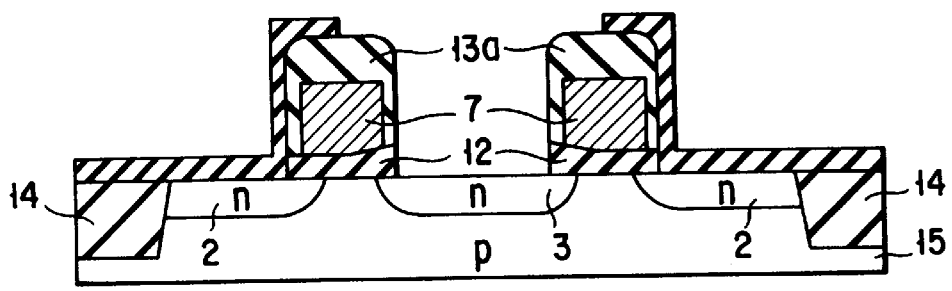

In manufacturing steps thereof, after forming a gate electrode 7, an insulating film 13 is made remaining on a the side wall of the gate electrode 7 sharply edged by anisotropic etching, to form a side wall insulating film for the gate. After a shape shown in FIGS. 9A to 9C are thus obtained, for example, an oxidation protect insulating film 34 consisting of SiN is deposited by 5 to 50 nm on the entire surface. Thereafter, a resist 16 is applied, and a drain region 3 where a contact with respect to a data transfer line 8 is to be formed is opened by lithography. Further, the oxidation protect insulating film 34 is removed by etching to obtain a shape shown in FIGS. 27A to 27C.

Next, the resist 16 is removed, for example, by ashing, and thereafter, oxidation at 700 to 1000° C. is carried out, to selectively oxidize or nitride the gate electrode 7 or the semiconductor region 15 in the drain region 3 side where a contact with respect to the data transfer line 8 is to be formed. In this step, since an oxidation protect film 34 is formed in the side of the source region 2 connected to the storage node 5, the shape shown in FIG. 27C can be obtained without effecting oxidation in the side of the drain region 3.

The other remaining manufacturing steps are the same as those of the second embodiment subsequent to the gate formation step thereof, except for the step of forming a p+-type layer 30, and therefore, explanation of those steps will be omitted herefrom.

Figure 28:
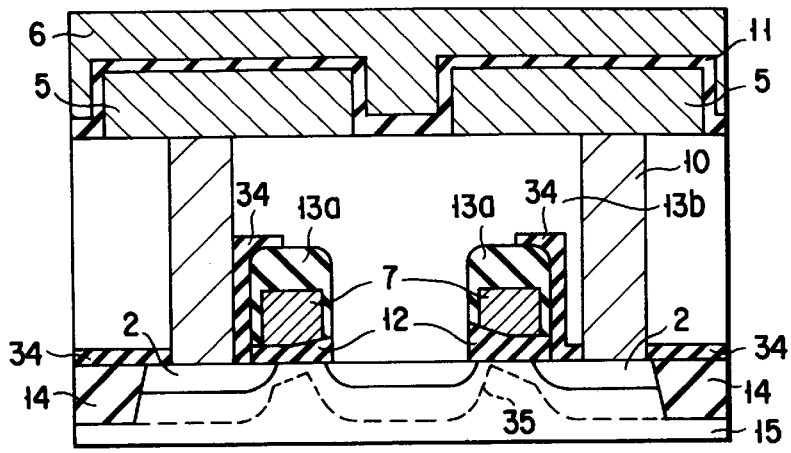
FIG. 28 is a view showing a state of an depletion layer below a channel according to the sixth embodiment.

In place of the method of thus partially increasing the thickness of the gate insulating film 12, the insulating film in the side of the source region 2 connected to the storage node 5 may be etched to be thinner. In addition, the thickness of the oxide film can be reduced by previously injecting nitrogen in the side of the source 2 by ion-implantation and then by performing gate oxidation, to restrict oxidation in the side of the source 2. Note that FIG. 28 shows a state of an depletion layer below a channel according to the present embodiment.

According to the present embodiment, it is not necessary to change the width of a transistor, but the threshold voltage can be controlled by adjusting the thickness of the gate insulating film 12. Therefore, the planar pattern of the present embodiment allows a greater degree of freedom in comparison with the third and fourth embodiments. Further, it is not necessary to form a gap on the element isolation insulating film 14, but the threshold voltage can be controlled by a slight change in thickness of a gate insulating film. As a result, margins for lithography and etching after gate formation can be enhanced.

Seventh Embodiment

Figure 29A:
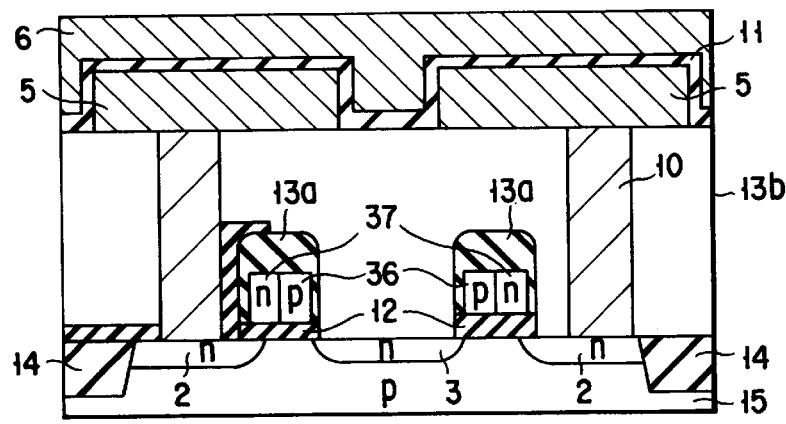
FIGS. 29A and 29B are cross-sectional views of a cell portion of a COB-type DRAM according to a seventh embodiment of the present invention.
Figure 29B:
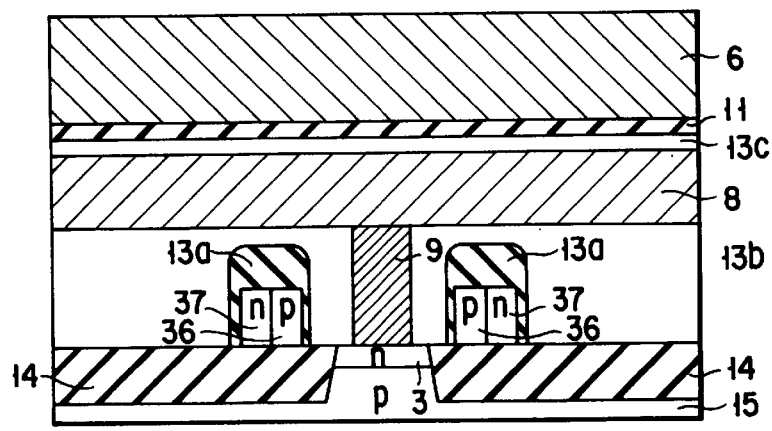

FIGS. 29A and 29B are cross-sectional views of a cell portion of a COB-type DRAM according to a seventh embodiment of the present invention. The present embodiment has the same plan view as shown in FIG. 4. FIGS. 29A and 29B respectively correspond to cross-sectional views cut along lines 5A—5A and 5B—5B in FIG. 4. Note that the same portions as those shown in FIGS. 4 and 5A and 5B are referred to by same reference symbols, and detailed explanation thereof will be omitted herefrom.

The present embodiment is basically similar to the second embodiment, except that the distribution of the impurity density of the gate electrode 7 is different from that of the second embodiment. The present embodiment is characterized in that the value of (donor density—acceptor density) of a portion of the gate electrode 36 close to the drain electrode 3 connected to the data transfer line contact 9 is smaller than the value of (donor density—acceptor density) of a portion of the gate electrode 37 close to the source electrode 2 connected to the storage node contact 10.

Here, in consideration of a gate made of p-type semiconductor and a gate made of n-type semiconductor, for example, the gate made of p-type semiconductor has a higher threshold voltage from a difference in work function, with respect to an n-type MOSFET which has a fixed channel impurity density. Therefore, by decreasing the value of (donor density–acceptor density) of a portion of the gate electrode 36 close to the drain electrode 3, the threshold voltage of this portion can be increased. Accordingly, by adopting this structure, it is possible to realize easily a transistor which satisfies a relation of Vth1<Vth2.

Figure 30A:
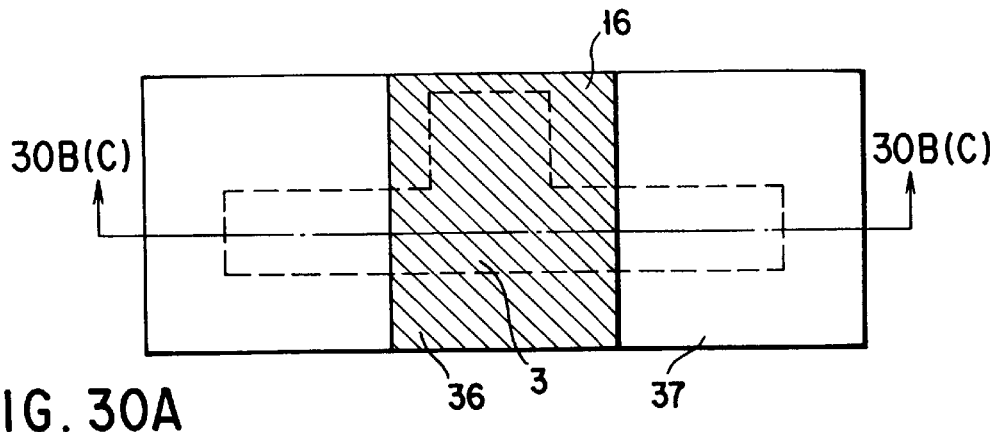
FIGS. 30A to 30C are a plan view and cross-sectional views showing a manufacturing step of the seventh embodiment.
Figure 30B:
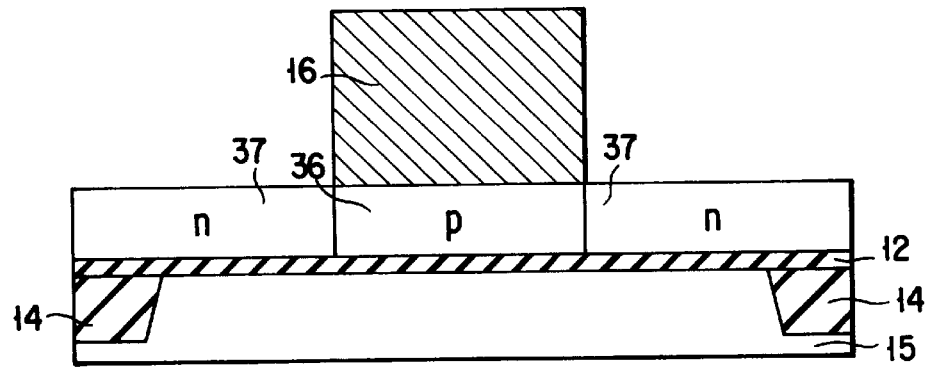
Figure 30C:
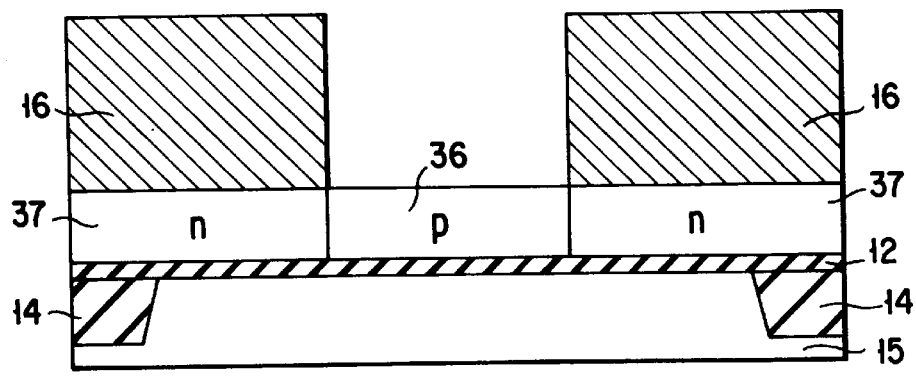
Figure 31A:
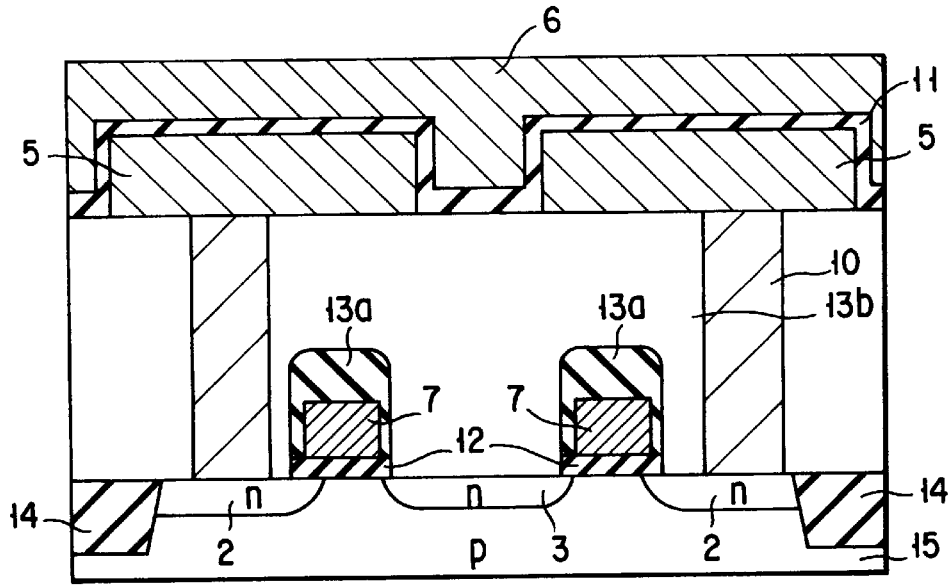
FIGS. 31A to 31D are cross-sectional views of a cell portion of a COB-type DRAM according to an eighth embodiment of the present invention.
Figure 31B:
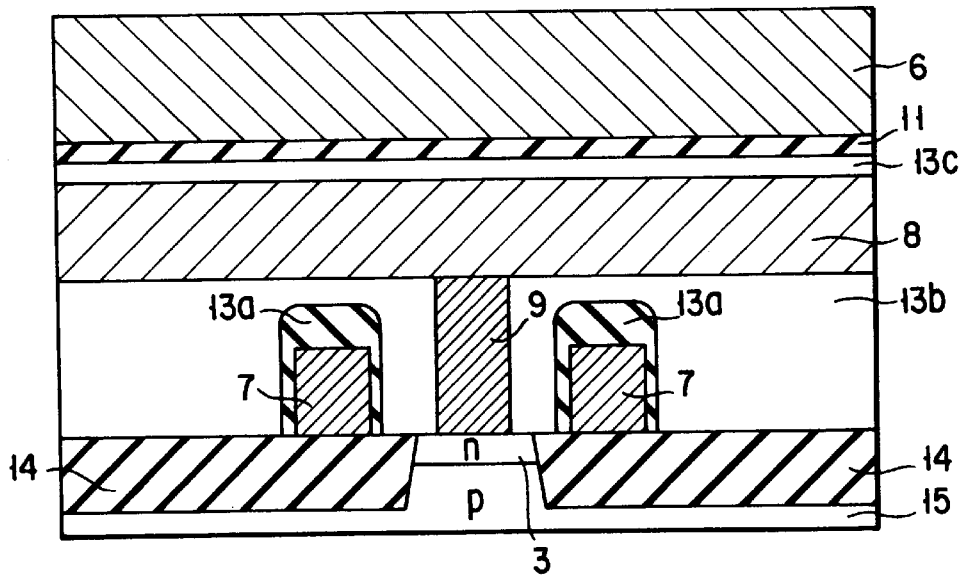
Figure 31C:
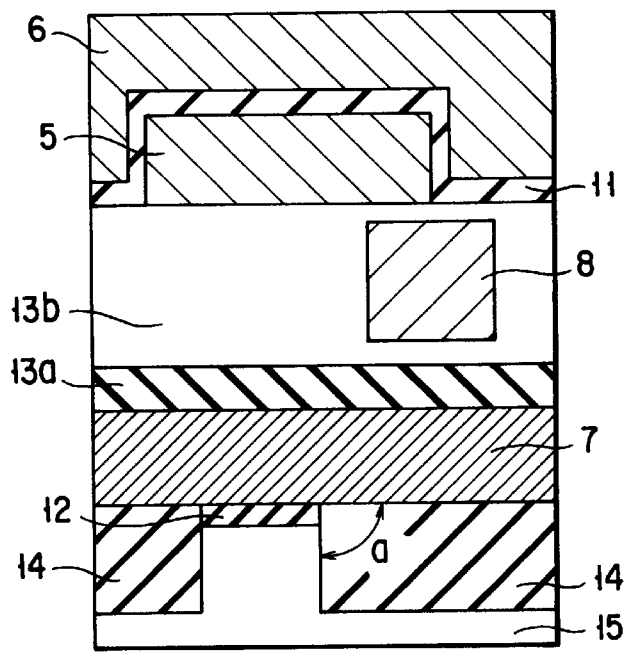
Figure 31D:
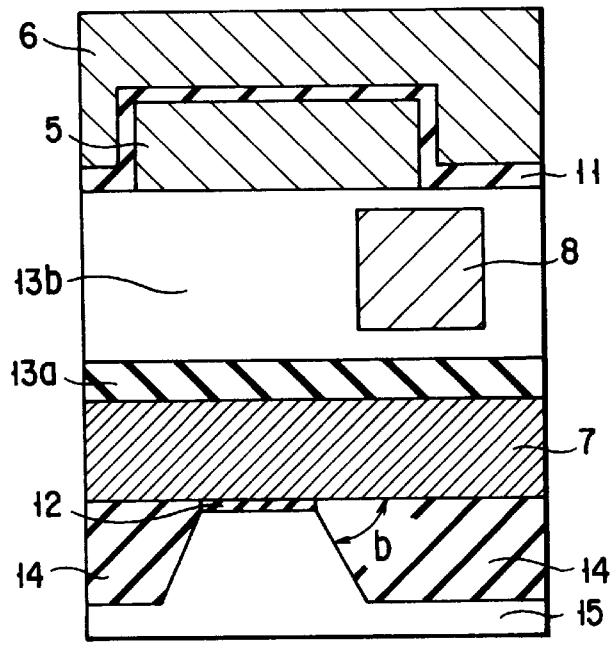

Manufacturing steps thereof are the same as those of the second embodiment, until a gate insulating film and a gate electrode 7 are formed after an element isolation insulating film 14 is formed. Thereafter, for example, ions as boron or $BF_2$ to form p-type impurities may be injected into the entire surface of the gate electrode 7 to previously make the gate electrode be of a p-type and have a low resistance. Thereafter, lithography is carried out by covering the transistor region close to the drain electrode 3 connected to the data transfer line contact 9, with a resist 16, as shown in FIGS. 30A and 30B.

Next, ions such as phosphorus or arsenic to form n-type impurities are selectively injected into a region 37, thereby to form a region 37 having a high value of (donor density–acceptor density) and a region 36 having a low value of (donor density–acceptor density). Thereafter, the resist 16 is removed by ashing or by an organic solvent, sulfuric acid and hydrogen peroxide process. Otherwise, an n-type impurity region 37 may be previously formed. Thereafter, lithography may be carried out such that a transistor region close to the drain electrode 3 connected to the data transfer line contact 9 forms an opening of the resist 16, and for example, impurities such as boron is injected by ion-implantation, to form a region 36 having a low value of (donor density–acceptor density). Further, doping of impurities may be carried out by diffusion using a $POCl_3$ gas in place of ion-implantation, or by diffusion of P, As, or B from a solid-phase diffusion source such as PSG, AsSG, or BSG.

According to the present embodiment, it is not necessary to change the width of a transistor, but the threshold voltage can be controlled by adjusting the impurity density of the gate electrode 7. Therefore, the planar patter of the present embodiment allows a greater degree of freedom in comparison with the third and fourth embodiments. In case of using a p-type semiconductor gate and an n-type semiconductor gate in a peripheral transistor, element formation can be performed with out increasing the number of steps.

Further, compared with the fourth embodiment, it is not necessary to form a gap on the element isolation insulating film 14. As a result, margins for lithography and etching after gate formation can be enhanced. Further, the diffusion capacitance of the drain electrode 3 is not increased, unlike in the second embodiment, and therefore, the capacitance of the data transfer line 8 can be reduced to be small.

Eighth Embodiment

FIGS. 31A to 31D are cross-sectional views of a cell portion of a COB-type DRAM according to an eighth embodiment of the present invention. The present embodiment has the same plan view as shown in FIG. 22.

FIGS. 31A to 31D respectively correspond to cross-sectional views cut along lines 23A—23A, 23B—23B, 23C—23C, and 23D—23D in FIG. 22. Note that the same portions as those shown in FIGS. 4 and 5A and 5B are referred to by same reference symbols, and detailed explanation thereof will be omitted herefrom.

The present embodiment is basically similar to the second embodiment, except that the inclination (denoted by a in FIG. 31C) of a portion of an element isolation close to the source electrode 2 connected to the storage node contact 10 is closer to 90° than the inclination (denoted by b in FIG. 31D) of the transistor side surface having a contact with a portion of an element isolation close to the drain electrode 3 connected to the data transfer line contact 9. As the inclination of the transistor having a contact with an element isolation increases, the gate electric field is more concentrated at the corner portion of the transistor so that the threshold voltage decreases more. Therefore, with use of this structure, it is possible to easily realize a transistor which satisfies a relation of Vth1<Vth2.

Figure 32:
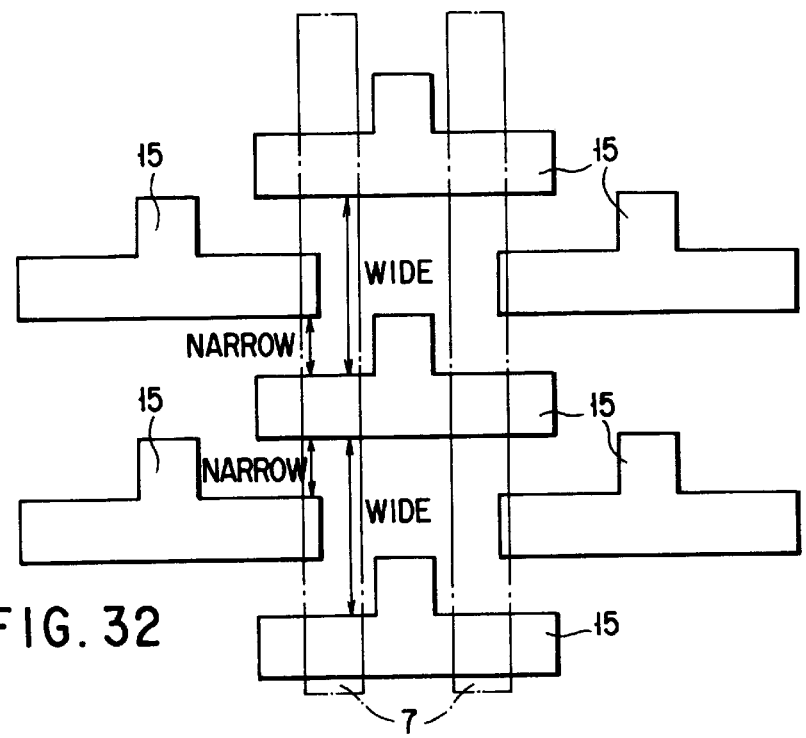
FIG. 32 is a plan view showing a pattern example which realizes an element isolation shape according to the eighth embodiment.
Figure 33A:
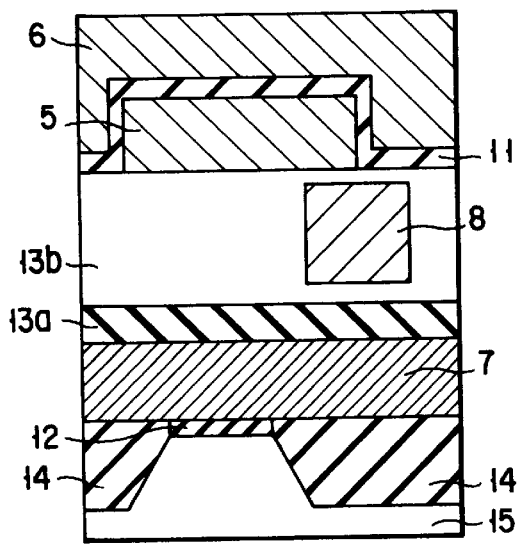
FIGS. 33A and 33B are cross-sectional views showing a modification of the eighth embodiment.
Figure 33B:
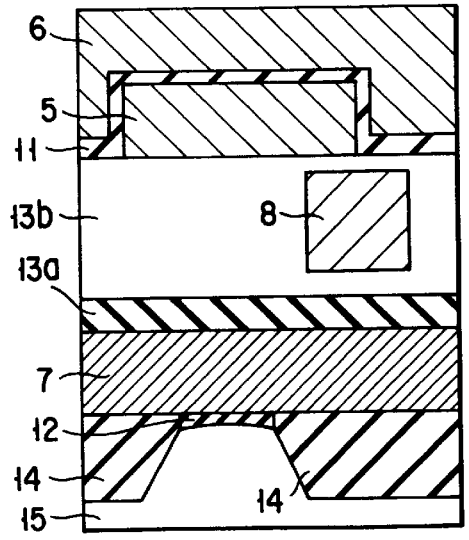

Manufacturing step thereof are the same as those of the second embodiment, excluding a step of forming p+-type region 30, and therefore, explanation thereof will be omitted herefrom. In order to change the inclination of the transistor side surface having a contact with an element isolation, the pattern should be arranged as shown in the plan view in FIG. 32, for example. In FIG. 32, at portions close to the drain electrode 3 connected to the data transfer line contact 9, the element isolation has a wide interval in comparison with the element isolation at portions close to the source electrode 2 connected to the storage node 10. For example, in etching of a silicon semiconductor, as the element isolation interval is narrowed, the inclination of a surface etched tends to increase. Therefore, a transistor which satisfies a relation of Vth1<Vth2 can be easily realized by making such a pattern arrangement in which the interval is wider at the portion close to the drain electrode 3 connected to the data transfer line contact 9 than at the portion close to the source electrode 2 connected to the storage node contact 10.

As a modification of the present embodiment, it is possible to realize a transistor in a manner in which the radius of curvature of the corner of the transistor having a contact with a portion of the element isolation close to the drain electrode 3 connected to the data transfer line contact 9 is set to be larger than the radius of curvature of the corner of the transistor having a contact with a portion of the element isolation close to the source electrode 2 connected to the storage node contact 10, for example.

Figure 34A:
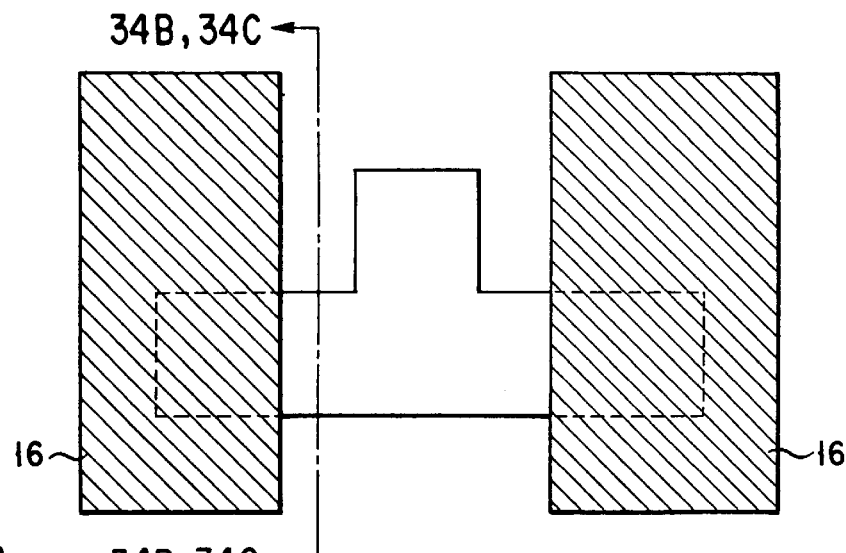
FIGS. 34A to 34C are a plan view and cross-sectional views showing a manufacturing step for realizing the structure shown in FIG. 33.
Figure 34B:
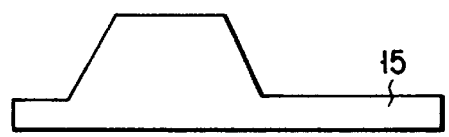
Figure 34C:
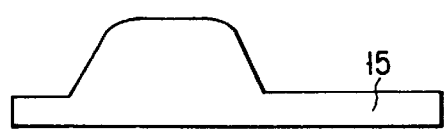

In manufacturing steps of the modification, after a groove to form a trench element isolation is formed, a portion close to the source electrode connected to the storage node contact 10 is covered with a resist 16, as shown in FIGS. 34A to 34C, and the corner of a portion not covered with the resist 16 is rounded by 5 to 200 nm by ion etching. FIG. 34A is a plan view thereof. FIG. 34B shows a shape of a cross-section cut along a line 34B(C)—34B(C) before rounding, and FIG. 34C shows a shape of a cross-section cut along a line 34B(C)—34B(C) after rounding.

Figure 35A:
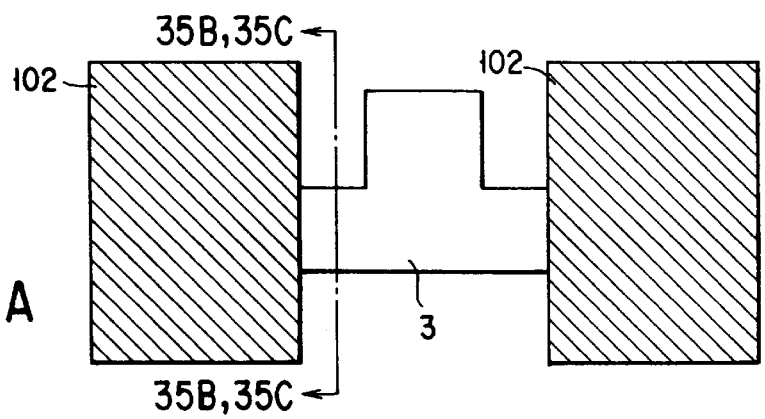
FIGS. 35A to 35C are a plan view and cross-sectional views showing another manufacturing step for realizing the structure shown in FIG. 33.
Figure 35B:
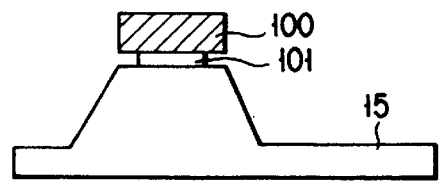
Figure 35C:
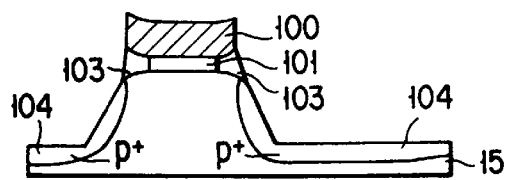

Further, it is possible to adopt a formation method as shown in FIGS. 35A to 35C. In this formation method, a groove to form a trench isolation is formed, and thereafter, a film 101 as a mask material for forming a groove of a trench and a film 100 are kept remaining. The film 101 may b a silicon oxide film, for example, and the film 100 may be a silicon nitride film, a polycrystal silicon film, or amorphous silicon. FIG. 35A is a plan view and FIG. 35B shows a shape of a cross-section cut along a line 35B(C)—35B(C) before rounding. Further, for example, after applying the resist 102 and carrying out the lithography, the silicon oxide film near the drain electrode connected to the bitline contact is removed by, for example, $NH_4F$ or the sulfuric acid. Thereafter, for example, the volume is expanded by oxidizing a semiconductor 15 in an oxidation atmosphere, and a bird's beak oxide material 103 is formed between the film 100 and the semiconductor 15, to round the surface of the region of the semiconductor 15, as shown in FIG. 35C. In addition, for example, boron ions may thereafter be injected by $10^{12}$ cm$^{-2}$ to $10^{15}$ cm$^{-2}$ at 10 to 100 keV to form a region 104 where the p-type density of the trench element isolation side wall is increased, so that the threshold voltage may be increased much more.

In this case, the acceptor density is $10^{16}$ cm$^{-2}$ to $10^{19}$ cm$^{-3}$.

According to the present embodiment, it is not necessary to change the width of a transistor, and therefore, the planar patter of the present embodiment allows a greater degree of freedom in comparison with the third and fourth embodiments. Further, in comparison with the fourth embodiment, it is thus not necessary to form a gap on the element isolation insulating film 14, and as a result, margins for lithography and etching after gate formation can be enhanced. In addition, since it is thus not necessary to form a gap on the element isolation insulating film 14, lithography, focus margins, and etching depth margins after formation of an element isolation can be improved.

In the second to eighth embodiments, a structure which satisfies a relation of Vth1<Vth2 causes, for example, asymmetry at the depletion layer end 35 below the gate 7, as shown in FIG. 28. In FIG. 28, the depth of the depletion layer end 35 having a structure corresponding to FIG. 26A is indicted by a broken line. This figure shows a case where the voltage difference between the source and drain is 0 V and where a voltage equal to or lower than a threshold voltage is applied to the gate electrode. In this case, the depth of the depletion layer end in the semiconductor at the depletion layer end below the gate 7 close to the source electrode connected to the storage node contact 10 from the semiconductor/gate-insulating film interface is greater than the depth of the depletion layer end in the semiconductor at the depletion layer end below the gate 7 close to the drain region 3 where a contact with the data transfer line is formed from the semiconductor/gate-insulating film interface, and therefore, an inversion layer is formed more easily, so that the threshold voltage is lowered. The sixth embodiment is cited here as an example, asymmetric relationship of the depletion layer shown in FIG. 28 can be obtained in the others of the second to eighth embodiments.

Ninth Embodiment

Figure 36A:
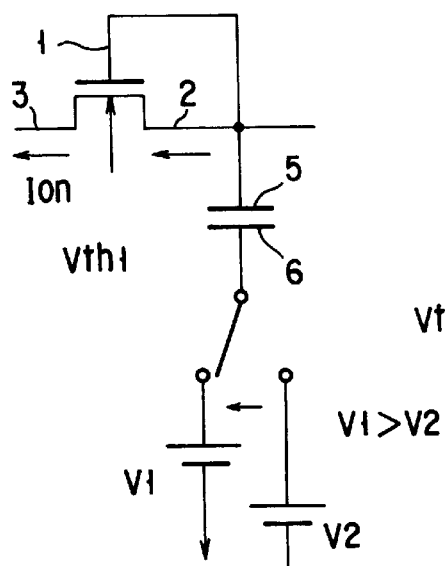
FIGS. 36A and 36B are circuit diagrams showing a semiconductor booster circuit according to a ninth embodiment.
Figure 36B:
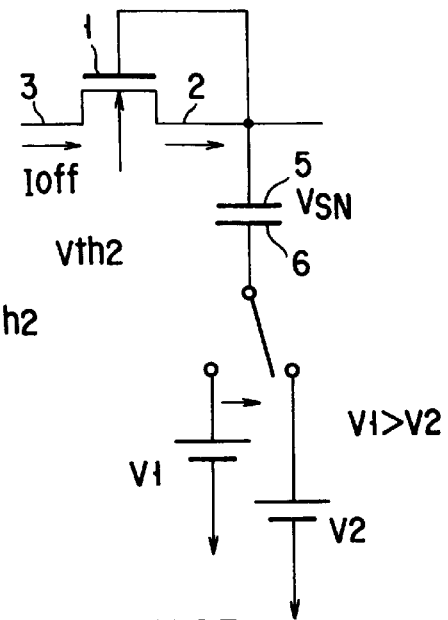

FIGS. 36A and 36B are circuit diagrams showing a semiconductor voltage conversion device according to a ninth embodiment of the present invention. FIG. 36A shows a case in which electric charges are transferred from a storage node 5 to a source or drain electrode 3 with a transistor turned on. FIG. 36B shows a case in which a storage node 5 is recharged with a transistor turned off.

The circuit shown in FIGS. 36A and 36B constitutes a charge pump circuit using a capacitor, and comprises a capacitor having a plate electrode 6 and a charge storage node 5 opposed to the plate electrode 6 with a capacitor insulating film inserted therebetween, and a field effect transistor having a gate electrode 1 connected to a gate control line 7, a first main electrode 3 (cited here as a drain electrode for conveniences) forming one of a source and a drain and connected to a data transfer line 8, a second main electrode (cited here as a source electrode for conveniences) forming the other of the source and drain and connected to the storage node 5 and the gate electrode 1, and a substrate electrode 4.

Voltages at respective portions of the circuit shown in FIGS. 36A and 36B are denoted by reference symbols as follows. Firstly, suppose that the voltage of the drain electrode 3 is V3 and the voltage of the storage node 5 is VSN. Indication of the potentials of the substrate electrode 4 and the plate electrode 6 will be omitted since these potentials are fixed to constant values in case of a bulk substrate or a SOI substrate having a body contact.

FIG. 36A shows a case in which a current is made flow from the storage node 5 to the drain electrode 3 with the transistor turned on. In this case, the voltage of the storage node 5 is higher than the voltage of the drain electrode 3, a current flows in a direction from the electrode 5 to the electrode 3. In this case, the threshold voltage of a cell transistor is expressed as Vth1, and a current flowing from the data transfer line and supplying the threshold voltage is expressed as Ith. Further, in consideration of a case where a current is made flow in a direction from the electrode 3 to the electrode 5, the threshold voltage at which the current flowing from the storage node 5 is Ith is expressed as Vth2.

The present invention is characterized in that Vth1<Vth2 is satisfied. The method of realizing the relation concerning the threshold voltage is the same as a method of realizing a cell transistor having asymmetric threshold voltages, and therefore, explanation thereof will be omitted herefrom.

In a charge pump circuit, basically, two power sources V1 and V2 are alternately switched between each other to move electric charges in a direction from the source electrode 2 to the drain electrode 3, and thus, a potential difference is obtained between the electrodes 2 and 3. FIG. 36A shows a case in which the voltage of the electrode 3 is boosted in comparison with the voltage of the electrode 2. Here, FIG. 36A shows a state where the plate voltage is switched from a voltage source V2 to a voltage source V1. In this state, since the voltage V1 is higher than the voltage V2, the plate potential increases. Accordingly, the potential of the storage node 5 increases, and the voltage of the gate electrode 1 increases by about (V1−V2) beyond the threshold voltage Vth1. As a result, the transistor is turned on and electric charges stored in the storage node 5 are transferred to the drain electrode 3. Where the potential of the storage node 5 turned on is VSN, the potential of the electrode 3 is VSN−Vth1. The decrease of the potential of the electrode 3 caused by Vth1 can be reduced by lowering the threshold voltage Vth1 of the transistor.

FIG. 36B shows a state where the plate voltage is switched from the voltage source V1 to the voltage source V2. In this state, since the voltage V2 is lower than the voltage V1, the plate potential decreases. Accordingly, the potential of the storage node 5 decreases by about (V1−V2) and the voltage of the gate electrode 1 is reduced to be equal to or lower than the threshold voltage Vth2. As a result, the transistor is turned off. Here, a sub-threshold current flows in a direction opposite to that in a ON-state from the drain electrode 3 to the source electrode 2, i.e., in the direction opposite to the direction in which the electric charges are transferred in FIG. 36A, so that a loss of transferred charges is caused. In order to restrict the loss of electric charges, the threshold voltage Vth2 of the transistor should preferably be increased. If the relation of Vth1<Vth2 is satisfied, the loss of electric charges can be much more reduced than in a conventional case.

In the structure according to the present embodiment, the threshold voltage of the MISFET can be increased where the potential of the source electrode 2 connected to the capacitor is set to be higher than the potential of the drain electrode 3 not connected thereto. Inversely, where the potential of the source electrode 2 connected to the capacitor is set to be lower than the potential of the drain electrode 3 not connected thereto, the threshold voltage of the MISFET can be lowered. Therefore, in case where a current is made flow from the source electrode 2 connected to the capacitor to the drain electrode 3 not connected thereto to discharge electric charges to the capacitor with the transistor turned on, a large drain current can be maintained by maintaining the threshold voltage to be low. Therefore, it is possible to discharge sufficient electric charges even when the capacitance of the capacitor is increased. A large output current can be obtained by increasing the driving frequency of the capacitor.

In addition, the decrease in the output voltage, corresponding to the threshold voltage of the transistor can be reduced, so that a much higher output voltage and a high conversion efficiency can be attained. Further, since the gate voltage required for obtaining a predetermined drain current can be restricted to be low, a voltage stress applied to the gate insulating film can be reduced. Therefore, an occurrence of a trap in an insulating film or an occurrence of an interface level caused by a voltage stress applied to an insulation can be restricted, and a change of a threshold voltage, a leakage current from an insulating film through a trap, a leakage current from a transistor through an interface level, and a parasitic capacitance can be restricted. In addition, a time until a gate insulating film causes an insulation break-down can be extended and a much thinner gate insulating film can be used.

On the contrary, in case where the transistor is turned off and electric charges are maintained, a sub-threshold leakage current from the drain electrode 3 not connected to the capacitor to the source electrode 2 connected to the capacitor can be reduced to be small by maintaining the threshold voltage to be high. Therefore, a loss of electric charges stored in the capacitor can be reduced to be small, and it is possible to restrict an increase of the power consumption and a decrease of the efficiency caused by a loss of electric charges.

Tenth Embodiment

Figure 37A:
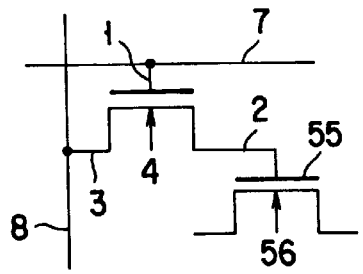
FIGS. 37A to 37C are circuit diagrams showing a semiconductor memory device according to a tenth embodiment.
Figure 37B:
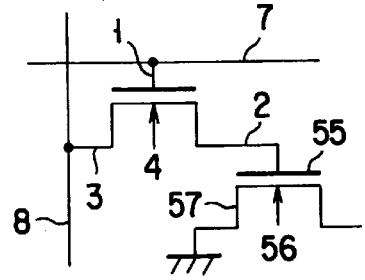
Figure 37C:
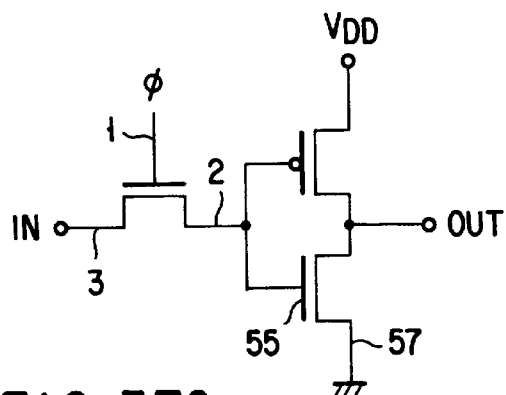

FIGS. 37A to 37C are circuit diagrams of a semiconductor memory device according to a tenth embodiment of the present invention.

The present embodiment is basically similar to the first embodiment, except that the storage node is constituted by a gate electrode 55 of a second MISFET and the other electrodes 55 and 56 of the second MISFET are used as plate electrodes. Specifically, in FIG. 37A, the substrate electrode 56 of the second MISFET serves as a plate electrode. In FIG. 37B, at least one of the source and drain of the second MISFET serves as a plate electrode. The second MISFET has a threshold voltage within a maximum amplitude range of the storage node.

In this structure, the conductance between the source and drain of the second MISFET changes depending on the amount of electric charges stored in the storage node 55, so that stored data can be read out in a non-destructive manner. In this case, when the potential of the data transfer line 8 decreases to be lower than that of the storage node 55, a leakage current flows from the storage node 55 to the data transfer line 8, thereby decreasing the potential of the storage node 55. Therefore, the voltage of the gate electrode 55 decreases, resulting in a problem that the conductance is not sufficient for reading. When data is written into the storage node 55 by increasing the potential of the data transfer line 8 to be higher than that of the storage node 55, the threshold voltage is increased by a substrate bias effect thereby impairing writing. Thus, in the structure of the present embodiment, the same problem as explained in the first embodiment takes place.

Therefore, also in the present embodiment, the threshold voltages of the MISFET are arranged so as to satisfy the relation of Vth1<Vth2, like in the first embodiment. Accordingly, the above problem is solved and the speed and the stability of operation are improved. Further, the present embodiment is characterized in that a second MISFET can be formed in the same process as taken for forming a gate insulating film and a gate electrode of a first MISFET and the number of manufacturing steps can thus be more reduced than when the gate forming step is used as the capacitor forming step.

Although the present embodiment uses one MISFET as a storage portion, the present embodiment is applicable to a semiconductor memory device as a so-called dynamic latch circuit whose storage portion consists of two MISFETs.

Note that the present invention is not limited to the embodiments as described above. Although the embodiments adopt a method of using a trench isolation as an element isolation, a so-called a LOCOS method may be adopted to form an element isolation. of course, it is possible to adopt a combination of a trench isolation and a LOCOS method. In addition, the Si film of the Silicon-on-Insulator can be used as the semiconductor substrate 15.

The method of preparing insulating films 11 to 14 may be a method in which oxygen or nitrogen is injected with a low acceleration energy of about 30 keV to form an insulating film, a method of depositing an insulating film, or a combination of these methods. In addition, the method of forming an element isolation film or an insulting film may be any other method than those for changing silicon into a silicon oxide film, a silicon nitride film, or a silicon oxynitride film, e.g., a method of injecting oxygen ions or nitrogen ions into deposited silicon or a method of oxidizing deposited silicon. A silicon oxide film may be a deposited oxide film made of silicate glass such as PSG or BPSG, or so-called TEOS. Of course, the insulating film may be a silicon nitride film, a ferroelectric film made of barium titanate, lead titanate, SrBiTaO, or barium strontium titanate, a paraelectric film made of barium titanate or a tantalum oxide film, a single layer film of mixed crystal of AlGaAs mixed in a GaAs substrate, or a combination film thereof.

Although the embodiments suppose a mono-crystal silicon substrate in which a p-type region is formed as a semiconductor region, the substrate may be a p-type or n-type mono-crystal silicon substrate or SiGe mixed crystal, SiC mixed crystal, GaAs, or InP may be used. Otherwise, a so-called SOI substrate may be used. Of course, an n-type semiconductor may be used and a p-type MISFET may be formed in place of an n-type MISFET.

As for source and drain regions, it has been suggested that n-type region are formed of phosphorus or arsenic. However, antimony may be used as a dopant and the regions may be formed by means of solid-phase diffusion or gas-phase diffusion with use of BPSG, PSG, or AsSG, for example, in place of ion-implantation. In addition, boron or indium may be injected or diffused to form a p-type region into an n-type substrate. Further, in case of using GaAs for a semiconductor region, Ge, Si, Sn, or Sb may used as a dopant for forming an n-type region and Zn, Be, or In may be used also as a dopant for forming a p-type region, by means of solid-phase diffusion or ion-implantation.

Although poly-crystal silicon or poly-crystal silicon added with arsenic has been suggested as a material for forming a gate electrode, a storage node, a plate electrode, and a data transfer line, it is possible to use a silicon film into which arsenic is injected by ion-implantation, or phosphorus or arsenic by means of solid-phase diffusion with use of PSG or AsSG. Otherwise, it is possible to use a so-called doped silicon film doped with phosphorus, arsenic, or boron at the same time when forming a film. Other than poly-crystal silicon, it is possible to use, for example, mono-crystal silicon, porous silicon, amorphous silicon, metal such as W, Ta, Ti, Hf, Co, Pt, Pd, Al, Cu, Ru, $RuO_2$, or $IrO_2$, conductive metal oxide, conductive metal nitride, or silicide thereof. It is also possible to use a layered structure of those materials.

Figure 38A:
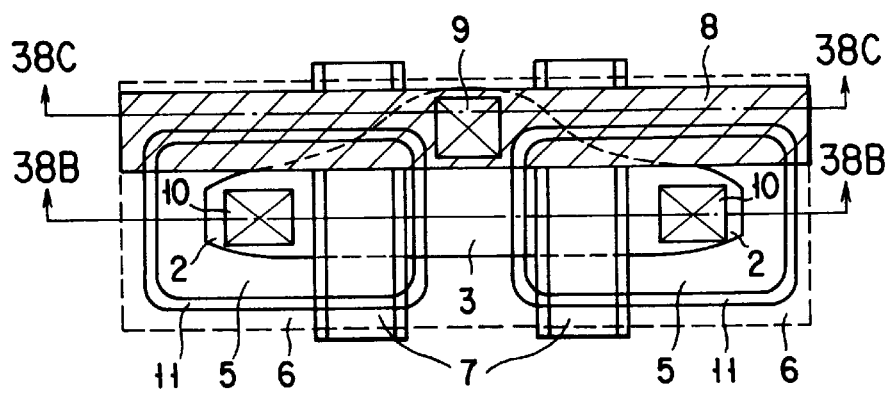
FIGS. 38A to 38C are a plan view and cross-sectional views showing a modification corresponding to the third embodiment.
Figure 38B:
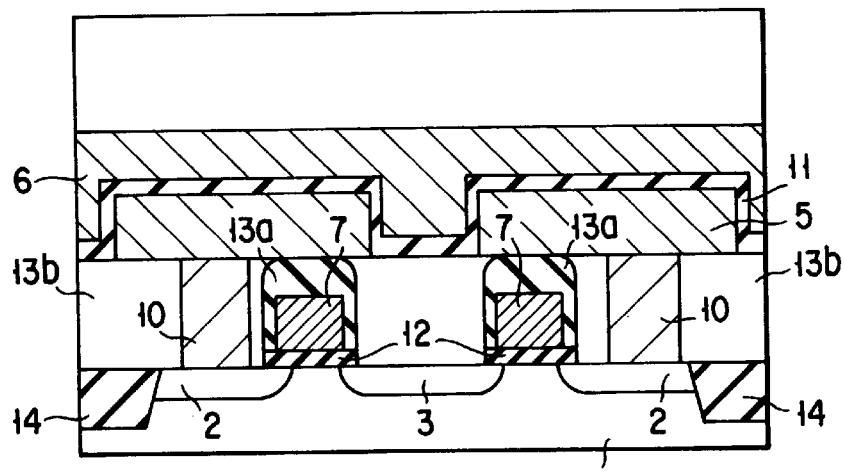
Figure 38C:
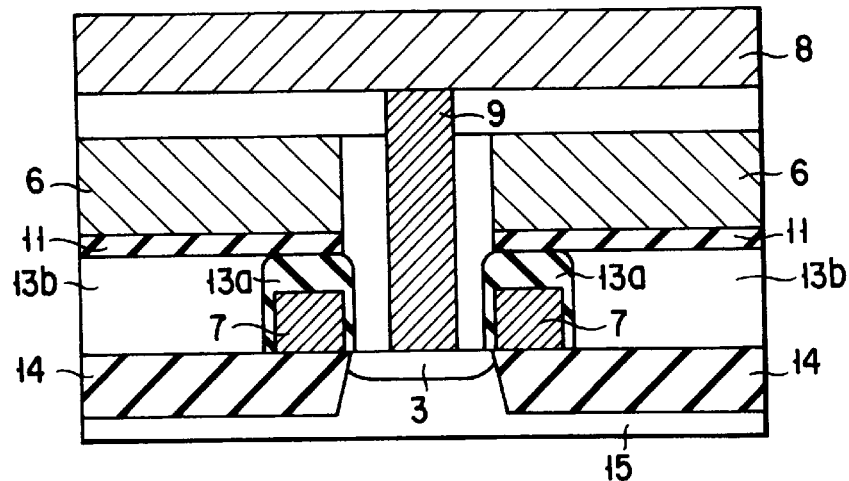

Although the second to eighth embodiments show structures of a COB-type DRAM, the embodiments relate to a transistor and allows arbitrary modifications with respect to the position and shape of a capacitor. For example, FIGS. 38A to 38C show a modification corresponding to the third embodiment. As shown in these figures, a charge storage capacitor (including a storage node 5, it is possible to adopt a stacked capacitor structure in which a capacitor insulating film 11, and a plate electrode 6) is formed below a data transfer line 8, or a DRAM using a trench-type capacitor or a DRAM using a flat-type capacitor is applicable. The method of forming a capacitor according to the ninth embodiment may be applied to any a stacked capacitor, a trench capacitor, and a flat capacitor.

The present invention further can be variously modified and practiced without deriving from the subject matter of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. A semiconductor device comprising:
   a transistor having a gate, a source, and a drain, one of the source and drain being a first end and the other being a second end; and
   a capacitor comprising a storage node connected to the first end, and a plate electrode, wherein
      a first current flowing between the source and drain when a potential Va is applied to said second end and a potential Vb, which is higher than Va, is applied to said storage node is smaller than a second current flowing between the source and drain when a potential Vb is applied to said second end and a potential Va is applied to said storage node, while a potential of the gate and a potential of the plate electrode are maintained to be constant and a voltage of the gate is smaller than a threshold voltage.

2. A semiconductor device comprising:
   a transistor having a gate connected to a gate control line, a source, and a drain, one of the source and drain being a first main electrode connected to a data transfer line, and the other being a second main electrode; and
   a capacitor comprising a storage node connected to the second main electrode, and a plate electrode connected to a common electrode, wherein
      the transistor and the capacitor constitute a memory cell, and
      a threshold voltage when a potential Va is applied to said data transfer line and a potential Vb, which is higher than Va, is applied to said storage node is higher than a threshold voltage when a potential Vb is applied to said data transfer line and a potential Va is applied to said storage node, while the potential of the gate and a potential of the plate electrode are maintained to be constant.

3. A semiconductor device according to claim 2, wherein a current flowing between the source and drain is larger than a current flowing between the second main electrode and a substrate, when a voltage of the gate is smaller than a threshold voltage.

4. A semiconductor device according to claim 2, wherein a plurality of memory cells are connected to one data transfer line, and the data transfer line has a capacitance larger than the storage node has.

5. A semiconductor device according to claim 2, wherein an impurity density of a channel region in a side of the first main electrode is higher than in a side of the second main electrode, below the gate electrode.

6. A semiconductor device according to claim 5, wherein the channel region having the higher impurity density is formed by a mask different from a mask for forming the source or drain.

7. A semiconductor device according to claim 5, wherein the channel region having the higher impurity density is formed apart from an interface between the gate insulating film and the substrate.

8. A semiconductor device according to claim 2, wherein the transistor is a transistor having a threshold voltage which decreases as a channel width is narrowed, and the channel width is wider in a side of the first main electrode than in a side of the second main electrode.

9. A semiconductor device according to claim 2, wherein the transistor is a transistor having a threshold voltage which increases as a channel width is narrowed, the gate is substantially formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate is equal to a distance from the second cross-section to the other end of the gate, and a width of a transistor region having a contact with the gate through a gate insulating film along the substrate main surface on the first cross-section is narrower than a width of a transistor region having a contact with the gate through a gate insulating film along the substrate main surface on the second cross-section.

10. A semiconductor device according to claim 9, wherein the width of the transistor region on arbitrary one of the first cross-sections is narrower than the width of transistor region on arbitrary one of the second cross-sections.

11. A semiconductor device according to claim 2, wherein the transistor is a transistor having a threshold voltage which decreases as a channel width is narrowed, the gate is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate is equal to a distance from the second cross-section to the other end of the gate, and a width of a transistor region having a contact with the gate through a gate insulating film along the substrate main surface on the first cross-section is wider than a width of a transistor region having a contact with the gate through a gate insulating film along the substrate main surface on the second cross-section.

12. A semiconductor device according to claim 11, wherein the width of the transistor region on arbitrary one of the first cross-sections is wider than the width of transistor region on arbitrary one of the second cross-sections.

13. A semiconductor device according to claim 2, wherein the memory cell is formed on a semiconductor substrate, an element isolation insulating film is embedded in a peripheral region of the transistor, and an angle between the main surface of said semiconductor substrate and a side surface of the transistor region across said element isolation insulating film is greater at a side of the second main electrode than at a side of the first main electrode, in a channel width direction of the transistor.

14. A semiconductor device according to claim 2, wherein the transistor is formed along a substrate main surface, such that a side surface of the transistor is in contact with an element isolation insulating film, the gate electrode is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate electrode is equal to a distance from the second cross-section to the other end of the gate electrode, and an angle forming between the main surface of said semiconductor substrate and a side surface of the transistor region on the first cross-section across said element isolation insulating film is smaller than an angle forming between the main surface of said semiconductor substrate a side surface of the transistor region on the second cross-section across said element isolation insulating film.

15. A semiconductor device according to claim 2, wherein the capacitor includes a second transistor having a source a drain and a gate connected to the second main electrode to function as a storage node, a substrate electrode of the second transistor or at least one of the source and drain thereof is connected to a common electrode to form a capacitor between said second main electrode and the common electrode, and a threshold voltage of the second transistor is between a minimum voltage of the storage node and a maximum voltage of the storage node.

16. A semiconductor device according to claim 2, wherein the gate is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate is equal to a distance from the second cross-section to the other end of the gate, and in a direction normal to the substrate main surface, a distance of the gate insulating film from an end of a depletion layer in the substrate on the second cross-section is greater than a distance on the first cross-section, on condition that a potential difference between the source and drain is 0 V, and that a voltage of the gate is smaller than the threshold voltage.

17. A semiconductor device according to claim 2, wherein the transistor region is formed along a substrate main surface so as to have a side surface in contact with an element isolation insulating film, the gate is formed on a substrate main surface along a first direction, among first and second cross-sectional views parallel to each other below the gate electrode in the first direction, the first cross-section is closer to the first main electrode of the transistor than the second cross-section, a distance from the first cross-section to an end of the gate electrode is equal to a distance from the second cross-section to the other end of the gate electrode, and a height from an interface between the element isolation insulating film and the gate electrode to a an interface between the gate-insulating film and the substrate main surface around the side surface of the transistor region on the second cross-section is smaller than a height from an interface between the element isolation insulating film and the gate electrode to an interface between the gate-insulating film and the substrate main surface around the side surface of the transistor region on the first cross-section.

18. A semiconductor comprising:

a transistor having a gate, a source, and a drain, one of the source and drain being a first main electrode and the other being a second main electrode connected to the gate electrode; and a capacitor comprising a storage node connected to the second main electrode, and a plate electrode, wherein
a predetermined voltage is applied to the plate electrode such that the storage node has potentials of two values, one being a first voltage higher than a threshold voltage of the transistor and the other being a second voltage lower than the threshold voltage,
the storage node has a higher potential than the first main electrode when the storage node is applied with the first voltage, and the first main electrode has a higher potential than the storage node when the storage node is applied with the second voltage, and
the transistor has a lower threshold voltage when the storage node is applied with the first voltage than when the storage node is applied with the second voltage.

19. A semiconductor device comprising:

a transistor having a gate connected to a gate control line, a source, and a drain, one of the source and drain being a first main electrode connected to a data transfer line, and the other being a second main electrode; and a capacitor having a storage node connected to the second main electrode and a plate electrode connected to a common electrode, wherein
the transistor and the capacitor constitute a memory cell,
the storage node is electrically connected with alternatively two voltage sources having different voltages from each other via said the data transfer line and said transistor, and data are stored as information of an electric charge or an electric polarity, and
a retention time of an electric charge or an electric polarity is longer when data holding state is set after the storage node is connected to the first voltage source having a high voltage than when data holding state is set after the storage node is connected to the second voltage source having a low voltage.

20. A semiconductor device according to claim 19, wherein the data transfer line is connected to a plurality of memory cells, after said data transfer line is connected to the first voltage source and the gate voltage is set at the third predetermined voltage higher than the threshold voltage, then the first data retention time of the memory cell is determined on condition, that the memory cell is connected to the second voltage after changing the gate voltage to the fourth predetermined voltage lower than the threshold voltage, and after said data transfer line is connected to the second voltage source and the gate voltage is set at the third predetermined voltage, and then the second data retention time of the memory cell is determined on condition that the memory cell is connected to the first voltage after changing the gate voltage to the fourth predetermined voltage, and the first data retention time is longer than the second data retention time.

21. A semiconductor device according to claim 2, wherein the transistor region is formed along a substrate main surface so as to have a side surface in contact with an element isolation insulating film, the gate is formed along a first direction, among first and second cross-sectional views parallel to each other below the gate electrode in the first direction, the first cross-section is closer to the first main electrode of the transistor than the second cross-section, a distance from the first cross-section to an end of the gate electrode is equal to a distance from the second cross-section to the other end of the gate electrode, and a radius of curvature of a corner portion comprising the semiconductor region formed by a side surface of the transistor region and by an interface between the semiconductor region and a gate insulating film on the first cross-section, is greater than a radius of curvature of a corner portion on the second cross-section.

* * * * *